United States Patent [19]
Tanuma et al.

[11] Patent Number: 5,620,784
[45] Date of Patent: Apr. 15, 1997

[54] MAGNETORESISTIVE FILM

[75] Inventors: Toshio Tanuma; Minoru Kume, both of Osaka, Japan

[73] Assignee: Sanyo Electric Co., Ltd., Moriguchi, Japan

[21] Appl. No.: 511,012

[22] Filed: Aug. 3, 1995

[30] Foreign Application Priority Data

Aug. 4, 1994 [JP] Japan .................................. 6-183722

[51] Int. Cl.$^6$ ...................................... H01F 10/14
[52] U.S. Cl. .................. 428/212; 428/216; 428/611; 428/675; 428/676; 428/692; 428/693; 428/900; 360/113; 324/252; 338/32 R
[58] Field of Search .................... 428/611, 675, 428/676, 692, 900, 212, 216, 693; 360/113; 324/252; 338/32 R

[56] References Cited

U.S. PATENT DOCUMENTS

| | | | |
|---|---|---|---|
| 3,567,525 | 3/1971 | Graham et al. | 148/31.57 |
| 3,975,772 | 8/1976 | Lin | 360/113 |
| 4,187,553 | 2/1980 | Ahn et al. | 455/89 |
| 4,949,039 | 8/1990 | Grünberg . | |
| 5,117,321 | 5/1992 | Nakanishi et al. | 360/120 |
| 5,134,533 | 7/1992 | Friedrich et al. | 360/113 |
| 5,164,025 | 11/1992 | Hasegawa | 148/313 |
| 5,268,043 | 12/1993 | McCowen | 428/611 |
| 5,277,991 | 1/1994 | Satomi et al. | 428/611 |
| 5,304,975 | 4/1994 | Saito et al. | 338/32 R |
| 5,366,815 | 11/1994 | Araki et al. | 428/611 |
| 5,432,734 | 7/1995 | Kawano et al. | 365/158 |
| 5,442,508 | 8/1995 | Smith | 360/113 |
| 5,510,172 | 4/1996 | Araki et al. | 428/213 |

FOREIGN PATENT DOCUMENTS

| | | |
|---|---|---|
| 58-36406 | 8/1983 | Japan . |
| 4-218982 | 8/1992 | Japan . |
| 4-358310 | 12/1992 | Japan . |
| 4-360009 | 12/1992 | Japan . |

OTHER PUBLICATIONS

Inomata et al "Giant Magnetoresistance Effect and Magnetic Anisotropy in Co$_9$Fe/Cu/Co$_9$Fe Trilayers on MgO(110) Substrates" J. Magnetism & Magnetic Materials 137 (1994) 257–263.

A. E. Berkowitz et al. "Giant Magnetoresistance in Heterogeneous Cu–Co Alloys" Physical Review Letters, vol. 68, No. 25, Jun. 1992, pp. 3745–3748.

A. Chaiken et al. "Low–field spin–valve magnetoresistance in Fe–Cu–Co sandwiches" Appl. Phys. Lett. 59 Jul. 1991, pp. 240–242.

B. Dieny et al. "Giant Magnetoresistance of Magneticallly Soft Sandwiches: Dependence on Temperature and on Layer Thicknesses"Physical Review B, Jan. 1992, pp. 806–813.

(List continued on next page.)

Primary Examiner—Stevan A. Resan
Attorney, Agent, or Firm—W. G. Fasse; W. F. Fasse

[57] ABSTRACT

A magnetoresistive film includes, arranged in the following order, a substrate, a first ferromagnetic layer, a non-magnetic metal film, and a second ferromagnetic layer which has a coercive force different from that of the first ferromagnetic layer. The magnetoresistive film has an uneven number of inflection point(s) in its magnetization hysteresis curve in the process of magnetization transition from a first saturation magnetization state to a second saturation magnetization state, with a magnetic field change quantity Hb and a magnetic field change quantity Ha being in the following relation:

$$Ha/Hb \leq 1$$

where Ha and Hb are respectively expressed as $Ha=|H_2-H_0|$ and $Hb=|H_1-H_0|$, with $H_0$, $H_1$ and $H_2$ respectively representing the magnetic field at the intermediate inflection point, the magnetic field corresponding to 95% of said first saturation magnetization, and the magnetic field corresponding to 95% of said second saturation magnetization after transition.

20 Claims, 31 Drawing Sheets

OTHER PUBLICATIONS

D. H. Mosca et al. "Oscillatory interlayer coupling and giant magnetoresistance in Co/Cu multilayers" Journal of Magnetism and Magnetic Materials 94 (1991), pp. L.1 –L.5.

Dieny et al. "Giant Magnetoresistance in Soft Ferromagnetic Layers" Pysical Review Condensed Matter, 43 (1991) Jan. vol.1, Part B.

J. Smyth et al. "Hysteresis in Lithorgraphic Arrays . . . ", J. Appl. Phys. Apr. 1994, vol. 69, No. 8, pp. 5262–5266.

Shinjo et al. "Metallic Superlattices –Artificially Structured Materials", ; Studies in physical and theoretical Chemistry 49; 1987.

Maeda et al.; "Magnetoresistance characteristics of grain–type alloy thin films of various compositions", J. Phys.: Condens. Matter 5 (1993) 6745–6752.

S. H. Liou et al. "The process–controlled magnetic properties of nanostructured Co/Ag composite films" J. Appl. Phys. 70 Nov. 1991 (Magnetism of Fine Particles) pp. 5882–5884.

P. Grünberg et al., Interlayer Exchange, Magnetotransport and Magnetic Domains in Fe/Cr Layered Structures, Journal of Magnetism and Magnetic Materials, 1992, pp. 1734–1738.

S. Demokritov et al., Evidence for Oscillations in the Interlayer Coupling of Fe Films Across Cr Films from Spin Waves and M(H) Curves, Europhysics Letters, Aug. 1991, pp. 881–886.

Hideo Fujiwara et al., Analytical Model of Giant MR in Multilayers with Biquadratic Coupling, Journal of Magnetism and Magnetic Materials, 1994, pp. L 23–L 29.

Martin Parker et al., Biquadratic Effects in Magnetic Multilayers with Low–Field Giant MR, Journal of the Magnetics Society of Japan, vol. 18, 1994, pp. 371–377.

MAGNETORESISTIVE FILM

CROSS-REFERENCE TO RELATED APPLICATION

The present application relates to copending U.S. application Ser. No. 08/406,671, filed on Mar. 20, 1995 and entitled MAGNETORESISTIVE ELEMENT.

BACKGROUND OF THE INVENTION

1. Field of the Invention

The present invention relates to a magnetoresistive film which is applied to a magnetoresistive element (MR element) such as a magnetoresistive magnetic head (MR head) or a magnetic sensor (MR sensor) for reading an information signal from a magnetic medium.

2. Description of the Background Art

A magnetoresistive element, which is adapted to detect a change in electrical resistance of a magnetic substance caused by application of a magnetic field for measuring the magnetic field strength or its change, must have a high magnetoresistance ratio and excellent magnetic field sensitivity, i.e., a small operating magnetic field, in general.

There has recently been proposed a magnetoresistive element employing a magnetoresistive film of a sandwich film structure having first and second ferromagnetic layers which are partitioned or separated from one another by a layer of a non-magnetic metal, as a magnetoresistive element having a high magnetoresistance ratio and high magnetic field sensitivity. Such a magnetoresistive element utilizes a spin valve effect of implementing parallel and antiparallel states of magnetization through deviation in magnetization transition between the ferromagnetic layers. For example, Japanese Patent Laying-Open No. 4-358310 (1992) discloses a magnetoresistive element having a sandwich film structure consisting of first and second ferromagnetic layers which are partitioned by a layer of a non-magnetic metal body so that these ferromagnetic layers are different in coercive force from each other.

Such a magnetoresistive element utilizes the aforementioned spin valve effect to implement parallel and antiparallel states of magnetization between the ferromagnetic layers resulting from difference in coercive force, thereby causing a magnetoresistance change. In the magnetoresistive element utilizing such a spin valve effect, it is necessary to eliminate a magnetic coupling force between the ferromagnetic layers which are positioned on both sides of the film of the non-magnetic metal body to the utmost. In other words, a high magnetoresistance change (high MR ratio) and high magnetic field sensitivity (low Hs) can be attained when the magnetic properties of the first and second ferromagnetic layers are independently changed with no mutual interference.

In order to reduce magnetic interaction between the first and second ferromagnetic layers, it is necessary to sufficiently increase the thickness of the non-magnetic metal film which is interposed therebetween. When the thickness of the non-magnetic metal film is increased, however, the proportion of by conduction electrons subjected to spin-dependent scattering, which are regarded as being mainly generated in the interface between the ferromagnetic layers, among all conduction electrons in the non-magnetic metal film is reduced. Therefore, an influence which is exerted on the conduction electrons of the non-magnetic metal film by magnetization changes of the first and second ferromagnetic layers is so reduced that a high magnetoresistance change cannot be attained.

When the thickness of the non-magnetic metal layer is reduced, on the other hand, ferromagnetic (ferric) magnetic coupling is caused between the first and second ferromagnetic layers to reduce the independence of magnetization transition of the first and second ferromagnetic layers. Thus, a high magnetoresistance change cannot be attained.

SUMMARY OF THE INVENTION

In order to solve such problems of the prior art, an object of the present invention is to provide a magnetoresistive film having a high magnetoresistance change (high MR ratio) and high magnetic field sensitivity (low Hs).

A magnetoresistive film according to a first aspect of the present invention comprises a first ferromagnetic layer which is provided on a substrate, a non-magnetic metal film which is provided on the first ferromagnetic layer, and a second ferromagnetic layer which is provided on the non-magnetic metal film and which has a coercive force being different from that of the first ferromagnetic layer. The magnetoresistive film has an uneven number of inflection point(s) in its hysteresis curve in the process of magnetization transition from a first saturation magnetization state to a second saturation magnetization state, with a magnetic field change quantity Hb (which is particularly defined below) between said first saturation magnetization state and the inflection point positioned intermediate among said inflection point(s) and a magnetic field change quantity Ha (which is particularly defined below) between said intermediate inflection point and said second magnetization state being in the following relation:

$$Ha/Hb \leq 1$$

or especially $$Ha/Hb \leq 0.95$$

where Ha and Hb are expressed as $Ha = |H_2 - H_0|$ and $Hb = |H_1 - H_0|$ respectively, with $H_0$, $H_1$ and $H_2$ respectively representing the magnetic field at the intermediate inflection point, the magnetic field corresponding to 95% of said first saturation magnetization, and the magnetic field corresponding to 95% of said second saturation magnetization after transition.

According to the first aspect, if the number of inflection point is only one, this one inflection point is the intermediate inflection point.

The first and second saturation magnetizations correspond to positive and negative saturation magnetizations in the hysteresis curve respectively.

A magnetoresistive film according to a second aspect of the present invention comprises a first ferromagnetic layer which is provided on a substrate, a non-magnetic metal film which is provided on the first ferromagnetic layer, and a second ferromagnetic layer which is provided on the non-magnetic metal film and which has a coercive force being different from that of the first ferromagnetic layer. This magnetoresistive film has a magnetization hysteresis curve with a neck and a steep magnetization transition portion following this neck.

A magnetoresistive film according to a third aspect of the present invention comprises a first ferromagnetic layer which is provided on a substrate, a non-magnetic metal film which is provided on the first ferromagnetic layer, and a second ferromagnetic layer which is provided on the non-magnetic metal film and which has a coercive force being different from that of the first ferromagnetic layer. When a magnetic field which is applied to this magnetoresistive film is changed, an MR ratio is relatively less-steeply changed up to the maximum value, and thereafter relatively more-steeply changed.

A magnetoresistive film according to a fourth aspect of the present invention comprises a first ferromagnetic layer which is provided on a substrate, a non-magnetic metal film which is provided on the first ferromagnetic layer, and a second ferromagnetic layer which is provided on the non-magnetic metal film and which has a coercive force being different from that of the first ferromagnetic layer. Magnetization of the first and second ferromagnetic layers is changed by a change of an external magnetic field, with a spin-flop transition.

A magnetoresistive film according to a fifth aspect of the present invention comprises a first ferromagnetic layer which is provided on a substrate, a non-magnetic metal film which is provided on the first ferromagnetic layer, and a second ferromagnetic layer which is provided on the non-magnetic metal film and which has a coercive force being different from that of the first ferromagnetic layer. This magnetoresistive film exhibits a diffraction peak of a face-centered cubic structure in an X-ray diffraction pattern.

According to the present invention, magnetic substances forming the first and second ferromagnetic layers can be selected from Co, Fe and Ni and alloys thereof such as NiFe, NiCo and FeCo, for example. A plurality of layers of such a magnetic substance may be stacked with each other, to form each of the ferromagnetic layers in a multilayer structure. In more concrete terms, NiFe/Co and Fe/Co multilayer films are employable.

According to the present invention, the first and second ferromagnetic layers are different in coercive force from each other. Such ferromagnetic layers having different coercive force values can be formed by a method of employing different ferromagnetic materials such as soft and hard magnetic materials for the first and second ferromagnetic films respectively, or a method of changing structures of identical magnetic materials by oxidation or nitriding to attain different coercive force values, for example.

While the first and second ferromagnetic layers are not particularly restricted in thickness, the first ferromagnetic layer is preferably 40 to 100 Å in thickness when the same is formed by an NiFe film. It is possible to attain a high MR ratio and a high magnetoresistance ratio per unit magnetic field by setting the thickness of the first ferromagnetic layer in this range.

According to the present invention, the non-magnetic metal film is adapted to partition or separate the first and second ferromagnetic layers from each other. The non-magnetic material is preferably prepared from a highly conductive metal such as a noble metal such as Au or Ag, or Cu, Pt or Pd. In consideration of the sensitivity and the cost, Cu is particularly preferable.

According to the present invention, the non-magnetic metal film is set at such a thickness that the first and second ferromagnetic layers exhibit an antiferromagnetic magnetic coupling force. If the thickness of the non-magnetic metal film is too small, the coupling force between the first and second ferromagnetic layers may be increased to exhibit strong ferromagnetic coupling (ferric coupling). The thickness of the non-magnetic metal film, which is varied with the materials for and the structures of the non-magnetic metal film and the first and second ferromagnetic layers, is preferably at least about 20 Å in general. The upper limit for the preferable thickness of the non-magnetic metal film, which is also varied with the materials for and the structures of the non-magnetic metal film and the first and second ferromagnetic layers, is preferably not more than about 60 Å. This is because the MR ratio tends to be reduced due to decrease in the rate of spin-dependent scattering in all conduction electrons in the non-magnetic metal film corresponding to a magnetization state of the ferromagnetic layers, when the thickness exceeds about 60 Å.

According to the inventors' experience, a ferromagnetic layer having a face-centered cubic structure is preferably formed as the first ferromagnetic layer, in order to couple the first and second ferromagnetic layers with each other by antiferromagnetic magnetic coupling. Due to formation of such a first ferromagnetic layer, it is conceivably possible to bring the non-magnetic metal film and the second ferromagnetic layer which are formed thereon similarly into face-centered cubic structures, thereby reinforcing the interaction between the first and second ferromagnetic layers.

It is also possible to attain a high MR ratio and high magnetic field sensitivity by stacking a plurality of sandwich structure films consisting of the first and second ferromagnetic layers which are partitioned or separated from each other by the non-magnetic metal films.

While the material for the substrate employed in the present invention is not particularly restricted, a non-magnetic substrate is preferably employed.

In the magnetoresistive film according to the fourth aspect of the present invention, magnetization of the first and second ferromagnetic layers is varied with a spin-flop transition. Since the spin-flop transition is abruptly caused, a high magnetoresistance ratio and high magnetic field sensitivity can be attained. While a conventional multilayer film of a sandwich structure eliminates magnetic coupling interaction between the first and second ferromagnetic layers to the utmost, the present invention implements the spin-flop transition through the first and second ferromagnetic films exhibiting antiferromagnetic coupling.

The magnetoresistive film according to the fifth aspect of the present invention exhibits a diffraction peak of a face-centered cubic structure in an X-ray diffraction pattern. In the magnetoresistive film according to the fifth aspect, all or at least one of the first and second ferromagnetic layers and the non-magnetic metal film has a face-centered cubic structure. It is conceivable that crystallinity of the overall multilayer film is thereby controlled and the first and second ferromagnetic films which are arranged through with the non-magnetic metal film therebetween exhibit an antiferromagnetic magnetic coupling force, whereby the magnetization can be changed with spin-flop transition.

The magnetoresistive film according to the present invention exhibits a high magnetoresistance change, i.e., a high MR ratio, while its magnetoresistance ratio per unit magnetic field is at a value which is extremely higher than that of the prior art. Thus, the inventive magnetoresistive film exhibits high magnetic field sensitivity, to be usefully applied to a magnetoresistive element such as an MR head or an MR sensor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Figure 1:
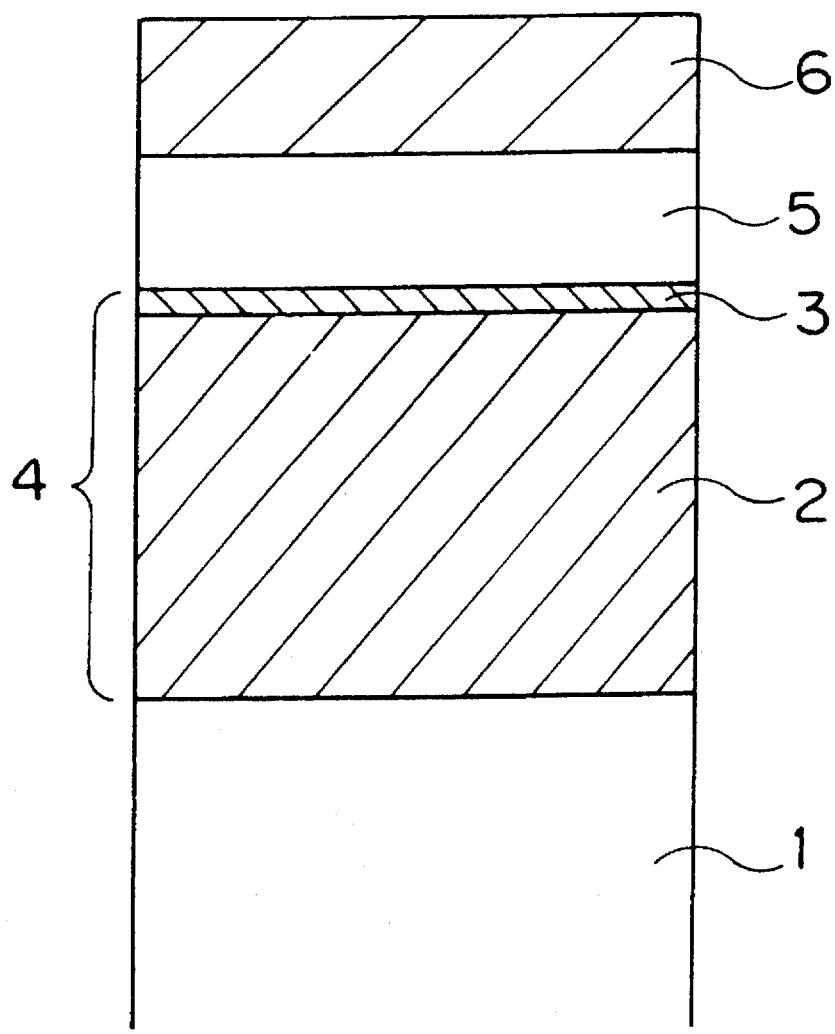
FIG. 1 is a typical sectional view showing a multilayer structure of a magnetoresistive film according to Example 1 of the present invention.

A magnetoresistive film shown in FIG. 1 was prepared. Referring to FIG. 1, an NiFe film 2, a Co film 3, a Cu film 5 and a Co film 6 were successively formed and stacked on a glass substrate 1. In the magnetoresistive film shown in FIG. 1, the NiFe film 2 and the Co film 3 correspond to a first ferromagnetic layer 4, while the Co film 6 and the Cu film 5 correspond to a second ferromagnetic layer and a nonmagnetic metal film respectively. The NiFe film 2 and the Co films 3 and 6 were set at thicknesses of 60 Å, 6 Å and 40 Å respectively, while the Cu film 5 was varied in thickness in the range of 20 to 40 Å. During preparation of the films, a magnetic field was unidirectionally applied to the substrate 1 at about 60 Oe, to form the films in the magnetic field by sputtering.

Figure 2:
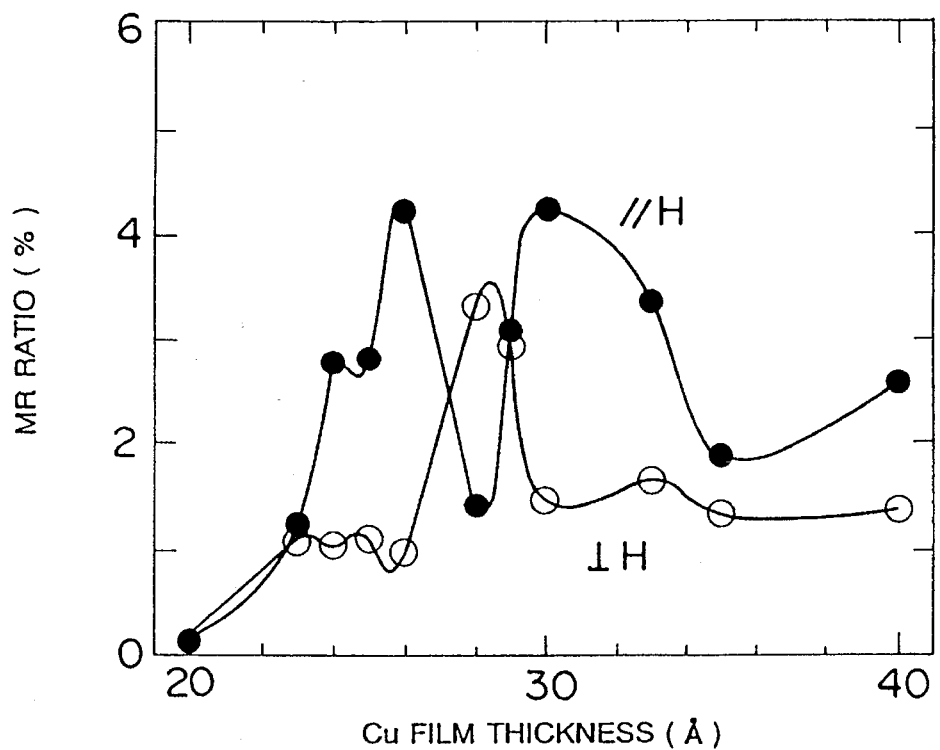
FIG. 2 shows relations between thicknesses of Cu films and MR ratios in the multilayer film structure of Example 1 shown in FIG. 1.

FIG. 2 illustrates relations between the thicknesses of Cu films and MR ratios. Referring to FIG. 2, marks ● show MR ratios which were measured when directions of application of magnetic fields were in parallel with substrate magnetic fields in preparation of the samples, while marks ○ show MR ratios which were measured when the former were perpendicular to the latter. It is understood from FIG. 2 that the MR ratios are varied with the thicknesses of the Cu films. Thus, it is understood that the NiFe film 2 and the Co film 3 forming the first ferromagnetic layer 4 and the Co film 6 serving as the second ferromagnetic layer have interaction, and are magnetically coupled with each other.

As shown in FIG. 2, the MR ratio which was measured when the direction of the measuring magnetic field was in parallel with the substrate magnetic field in preparation of the sample was reduced, while the MR ratio measured when the former was perpendicular to the latter was increased particularly around the Cu film thickness of about 28 Å. This may have resulted in correspondence to rotation of a spin axis, and conceivably is due to or suggests to that the direction of an apparent axis of easy magnetization was rotated by 90° from the substrate magnetic field direction in preparation of the samples. Spin axis rotation which is accompanied by spin-flop transition is decided by the balance of magnetic anisotropic energy of the multilayer film, external magnetic field vertical magnetization energy which is influenced by the strength of antiferromagnetic coupling, etc. Such rotation of the direction of the apparent axis of easy magnetization conceivably results from rotation of magnetization spin axes of the first and second ferromagnetic layers caused by the so-called spin-flop transition.

FIGS. 3 to 7 illustrate magnetic properties and MR properties upon application of measuring magnetic fields in parallel with substrate magnetic fields in preparation of samples. FIGS. 3, 4, 5, 6 and 7 correspond to Cu film thicknesses of 23 Å, 26 Å, 30 Å and 35 Å respectively. FIGS. 3, 4, 5, 6 and 7 illustrate magnetization hysteresis curves at FIGS. 3A, 4A, 5A, 6A, and 7A, and magnetic field dependence of the MR ratios at FIGS. 3B, 4B, 5B, 6B, and 7B respectively. The axes of ordinates are in arbitrary units (a.u.).

Referring to FIG. 3, in the MR ratio was gradually increased in response to changes of the external magnetic field to reach the maximum, value, and thereafter was abruptly reduced in the magnetic film having a relatively thin Cu film thickness. Such a phenomenon can be explained in correspondence to spin-flop transition.

Figures 9A, 9B, 9C, 9D:
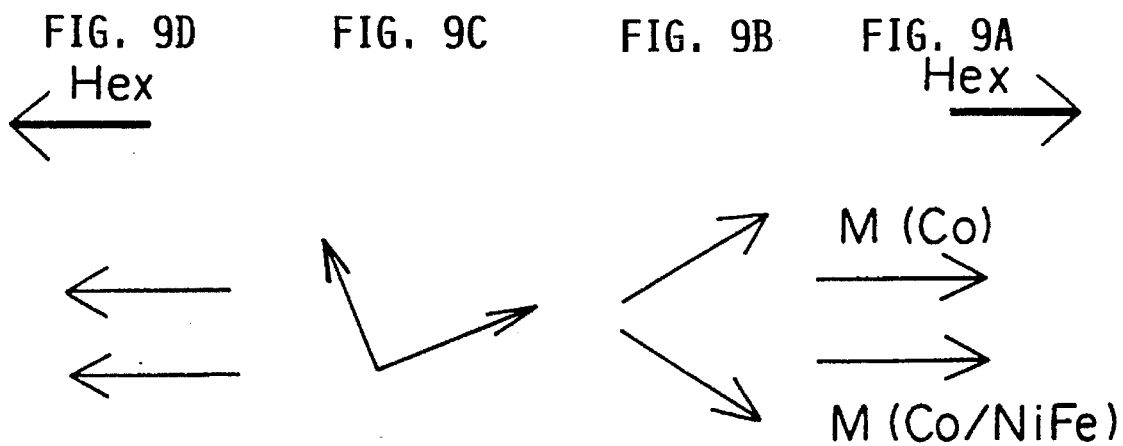
FIGS. 9A and 9D prensent a model diagram for illustrating several stages of a spin-flop transition.

FIG. 9 is a model diagram for typically illustrating movements of magnetization in spin-flop transition. Referring to FIG. 9, (Co/NiFe) and (Co) denote first and second ferromagnetic layers respectively. In a state shown in FIG. 9A, the first and second ferromagnetic layers are in states of saturation magnetization of the same magnetization direction. Following changes of an external magnetic field Hex the first and second ferromagnetic layers are changed from the state shown in FIG. 9A to a state shown in FIG. 9B, and further to a state shown in FIG. 9C. In the state of FIG. 9B, the magnetization directions of the first and second ferromagnetic layers are symmetrical with the same angle with respect to an easy axis of magnetization, while, in the state of FIG. 9C, the above magnetization directions are simultaneously rotated in the plane and are not parallel to each other but have an angle of about 90 degree therebetween. Upon a further change of the external magnetic field, the first and second ferromagnetic layers are brought into a parallel magnetization state by spin-flop transition, as shown at of FIG. 9D. Such transition from the state of FIG. 9C to the state of FIG. 9D is generally called spin-flop transition.

Figure 3A:
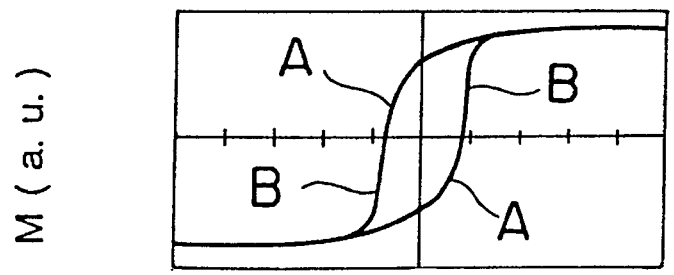
FIGS. 3A and 3B illustrate a magnetization hysteresis curve and magnetic field dependence of the MR ratio in relation to a sample 1-2 in Example 1 respectively.
Figure 3B:
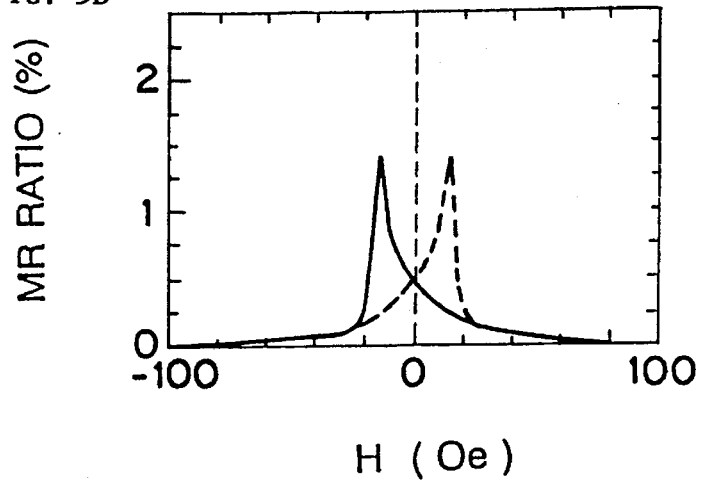

In the magnetization hysteresis curve shown in FIG. 3A, necks A and steep magnetization transition portions B following the necks A are recognized. Such necks A conceivably result from the difference in coercive force between the first and second ferromagnetic layers. The magnetization transition portions B conceivably correspond to the aforementioned spin-flop transition. Abrupt reduction of the MR ratio shown in FIG. 3B conceivably corresponds to such spin-flop transition.

Figure 4A:
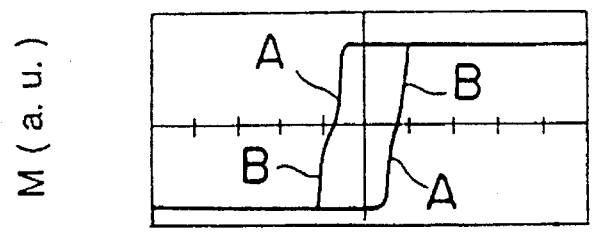
FIGS. 4A and 4B illustrate a magnetization hysteresis curve and magnetic field dependence of the MR ratio in relation to a sample 1-4 in Example 1 respectively.

In the magnetization hysteresis curve shown in FIG. 4A, necks A which are clearer than those shown in FIG. 3A and steep magnetization transition portions B following the necks A are recognized. Such necks A more clearly appeared conceivably because magnetic coupling between the first and second ferromagnetic layers was slightly weak, and conceivably resulted from the difference in coercive force between the first and second ferromagnetic layers. Also in the multilayer film exhibiting the hysteresis curve having such necks A, directions of magnetization of the respective ferromagnetic layers are conceivably rotated from the state of FIG. 9A to the states and of FIGS. 9B and 9C, similarly to the multilayer film exhibiting the hysteresis curve shown in FIG. 3A. Further, it is conceivable that the necks A were caused in the process up to the non-parallel arrangement with an angle of about 90 degree between the magnetization directions as shown in FIG. 9C and conceivably resulted from the fact that the magnetization vector of the magnetic layer having higher coercive force was rotated in correspondence to rotation of the magnetization vector of the magnetic layer having lower coercive force. It is also conceivable that the magnetization vectors of both magnetic layers were then arranged simultaneously in parallel with the direction of the external magnetic field due to spin-flop transition, which abruptly reduces film resistance.

The steep magnetization transition portions B following the necks a shown in FIG. 4A conceivably resulted from the spin-flop transition.

Figure 4B:
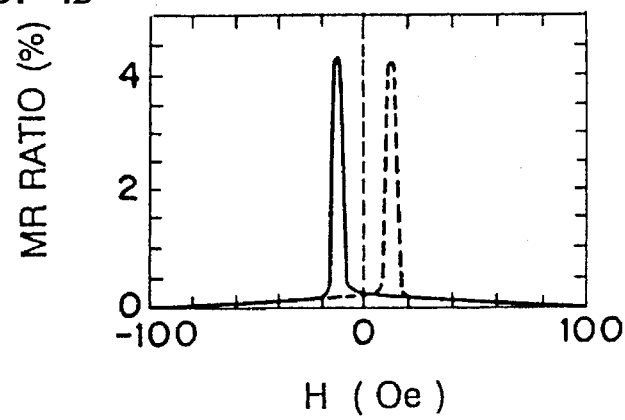

FIG. 4B shows high MR ratios following such spin-flop-like transition.

Figure 5A:
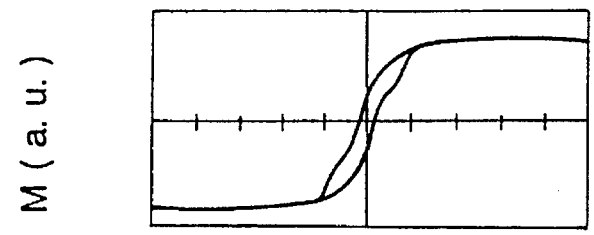
FIGS. 5A and 5B illustrate a magnetization hysteresis curve and magnetic field dependence of the MR ratio in relation to a sample 1-5 in Example 1 respectively.
Figure 5B:
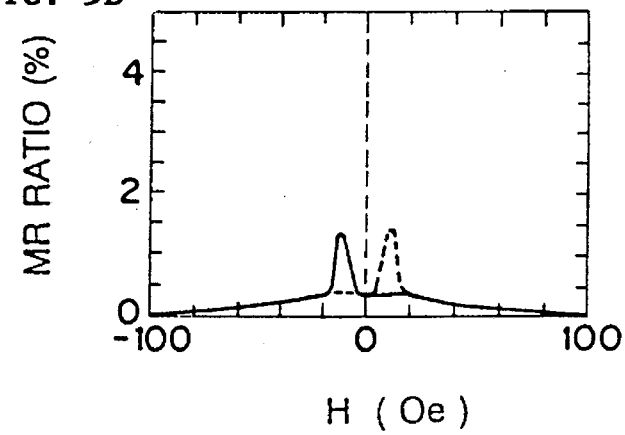
Figure 8A:
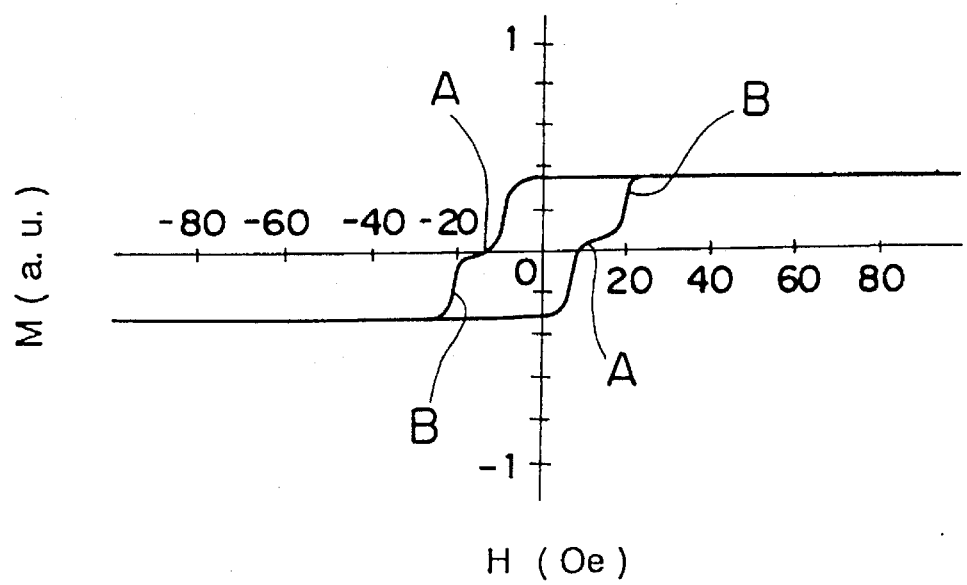
FIGS. 8(a) and 8(b) illustrate a magnetization hysteresis curve and magnetic field dependence of the MR ratio in relation to a sample 1-5 in Example 1, measured along a magnetization direction of a measuring magnetic field which was perpendicular to the magnetic field direction in preparation of the sample respectively.
Figure 8B:
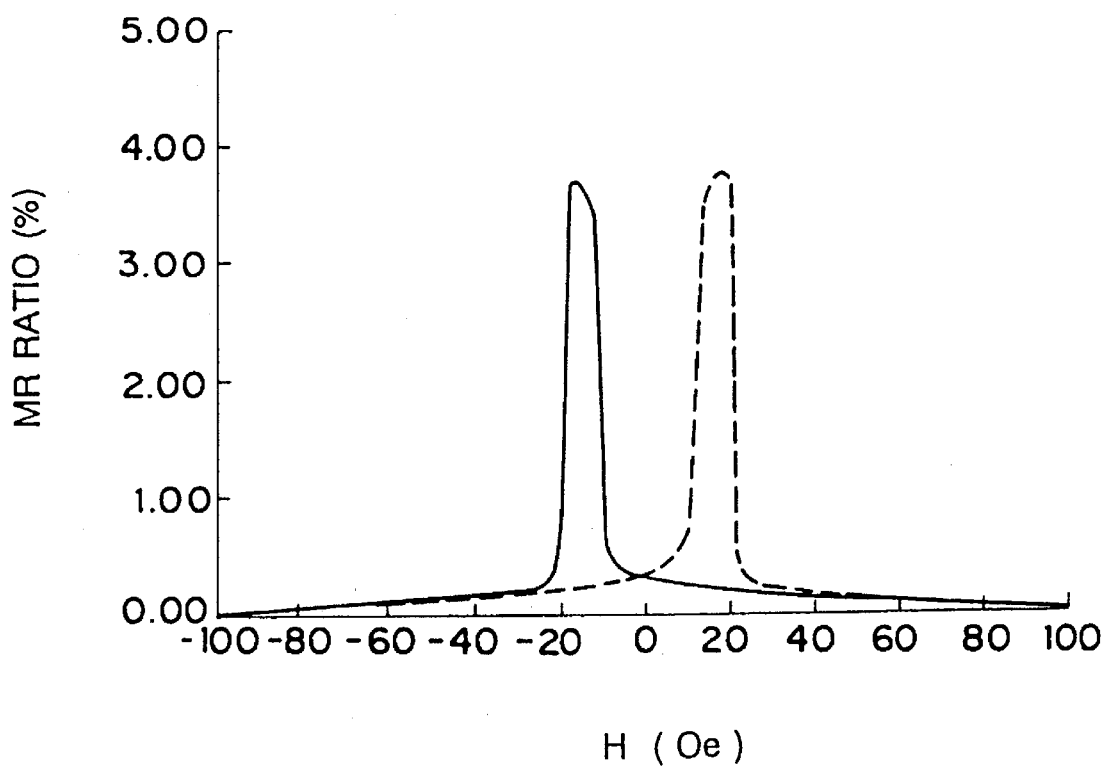

FIG. 5A illustrates a hysteresis curve which is different from that shown in FIG. 4A and FIG. 5B shows low MR ratios respectively. This is because the data were measured by applying the measuring magnetic field in parallel with the substrate magnetic field in preparation of the samples, as described above with reference to FIG. 2. When the measuring magnetic field is applied perpendicularly to the substrate magnetic field in preparation of the samples, a hysteresis curve and changes of the MR ratio which are similar to those shown in FIG. 4 are obtained. FIGS. 8(a) and 8(b) illustrate a hysteresis curve and MR ratios which were measured with perpendicular field application respectively, as described later. In the case of such a magnetoresistive film, therefore, the external magnetic field is preferably measured perpendicularly to the substrate magnetic field.

Figure 6A:
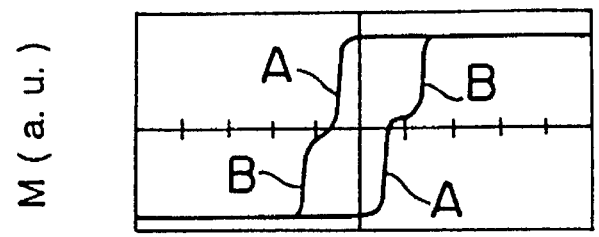
FIGS. 6A and 6B illustrate a magnetization hysteresis curve and magnetic field dependence of the MR ratio in relation to a sample 1-6 in Example 1 respectively.
Figure 6B:
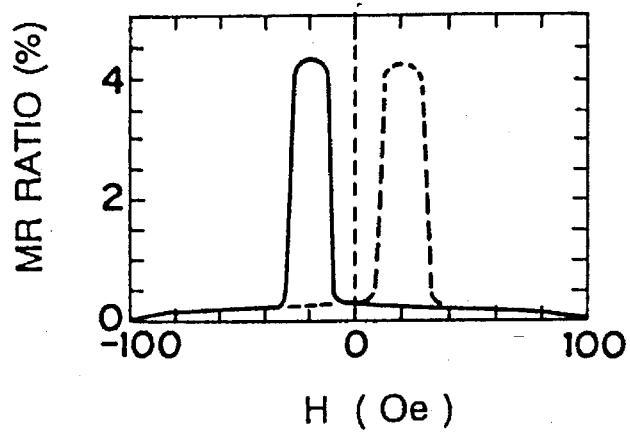

FIG. 6 illustrates a hysteresis curve of a magnetoresistive film having a Cu film thickness of 30 Å and changes of the MR ratio. The hysteresis curve shown in FIG. 6A has necks A and steep magnetization transition portions B following the necks A, similarly to the hysteresis curve shown in FIG. 4A.

Figure 7A:
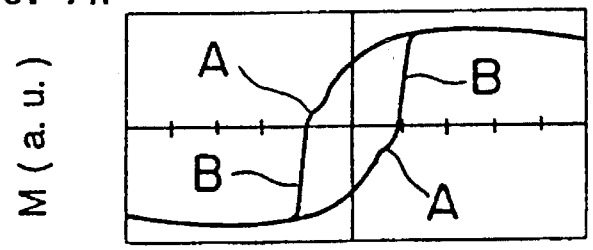
FIGS. 7A and 7B illustrate a magnetization hysteresis curve and magnetic field dependence of the MR ratio in relation to a sample 1-9 in Example 1 respectively.
Figure 7B:
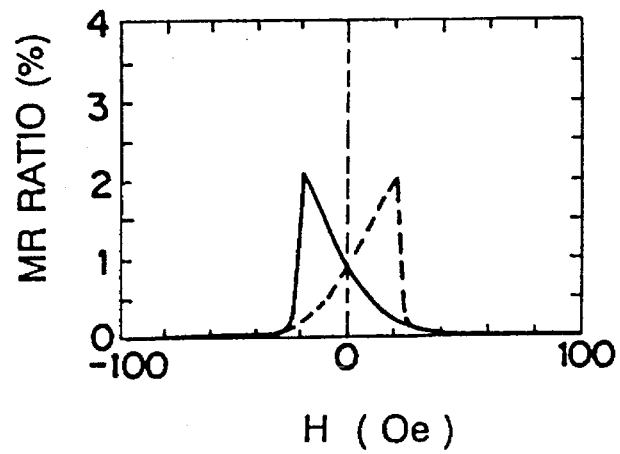

FIG. 7 illustrates a hysteresis curve of a magnetoresistive film having a Cu film thickness of 35 Å and changes of the MR ratio. The hysteresis curve shown in FIG. 7A has necks A and steep magnetization transition portions B following the necks A. The necks A are small similarly to those shown in FIG. 3A. Antiferromagnetic coupling between the magnetic layers may have conceivably been strengthened again since the thickness of the Cu film was increased to 35 Å. As shown in FIG. 7B, the MR ratio was remarkably changed in correspondence to the steep magnetization transition portions B of the hysteresis curve.

FIGS. 8(a) and 8(b) illustrate a hysteresis curve of a magnetoresistive film having a Cu film thickness of 28 Å and changes of the MR ratio. These data were obtained by perpendicularly applying a measuring magnetic field to the magnetic films described with reference to FIG. 5. As shown in FIG. 8(a), the hysteresis curve has necks A and steep magnetization transition portions B following the necks A in the case of applying the magnetic field perpendicularly to the substrate magnetic field, while a high MR ratio was exhibited as shown in FIG. 8(b).

Table 1 shows magnetoresistance ratios per unit magnetic field of the respective magnetoresistive films having Cu films of different thicknesses. Measuring magnetic field was applied in the direction which is parallel to the film surface and provides the maximum MR ratio. This also applies to other samples as hereinafter described.

TABLE 1

| Sample No. | Cu Film thickness (Å) | Magnetoresistance Ratio per Unit Magnetic Field (%/Oe) |
|---|---|---|
| 1-1 | 20 | 0.02 |
| 1-2 | 23 | 0.45 |
| 1-3 | 25 | 0.88 |
| 1-4 | 26 | 1.4 |
| 1-5 | 28 | 0.8 |
| 1-6 | 30 | 0.9 |
| 1-7 | 33 | 1.07 |
| 1-8 | 35 | 0.43 |
| 1-9 | 40 | 0.46 |

As clearly understood from Table 1, high magnetoresistance ratios were obtained under conditions of Example 1 with Cu film thicknesses of at least 23 Å. Thus, it is understood possible to attain high magnetic field sensitivity with a film thickness of at least about 20 Å.

Example 2

Figure 10:
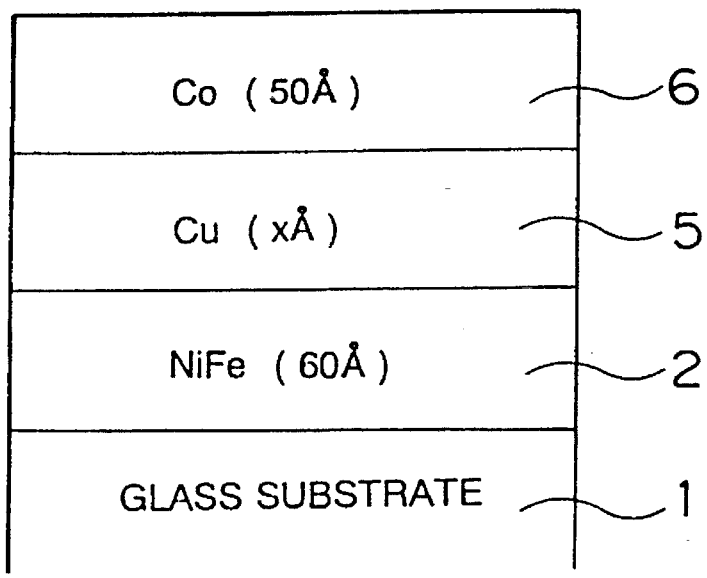
FIG. 10 is a typical sectional view showing the structure of a multilayer film according to Example 2 of the present invention.

A magnetoresistive film shown in FIG. 10 was prepared. As shown in FIG. 10, an NiFe film 2 of 60 Å in thickness serving as a first ferromagnetic layer, a Cu film 5 of x Å in thickness serving as a non-magnetic metal film, and a Co film 6 of 50 Å in thickness serving as a second ferromagnetic layer were successively formed and stacked on a glass substrate 1. The thickness x of the Cu film 5 was varied in the range of 18 to 60 Å, to prepare samples of the magnetoresistive film.

Table 2 shows MR ratios and magnetoresistance ratios per unit magnetic field of the respective samples.

TABLE 2

| Sample No. | Cu Film thickness (Å) | MR Ratio (%) | Magnetoresistance Ratio per Unit Magnetic Field (%/Oe) |
|---|---|---|---|
| 2-1 | 18 | 0 | 0 |
| 2-2 | 20 | 2.03 | 0.63 |
| 2-3 | 23 | 2.3 | 1.0 |
| 2-4 | 25 | 1.9 | 0.45 |
| 2-5 | 30 | 2.4 | 0.7 |
| 2-6 | 40 | 2.1 | 0.36 |
| 2-7 | 50 | 1.3 | 0.17 |
| 2-8 | 60 | 0.96 | 0.26 |

As shown in Table 2, both of the MR ratio and the magnetoresistance ratio were 0% in the sample 2-1 having a Cu film of 18 Å in thickness, conceivably because the first and second ferromagnetic layers exhibited strong ferromagnetic coupling. High MR ratios and high magnetoresistance ratios per unit magnetic field were attained when the thicknesses of the Cu films were in excess of 20 Å. In particular, high MR ratios and high magnetoresistance ratios per unit magnetic field were attained in the range of the Cu film thicknesses of 20 to 40 Å.

Figure 11:
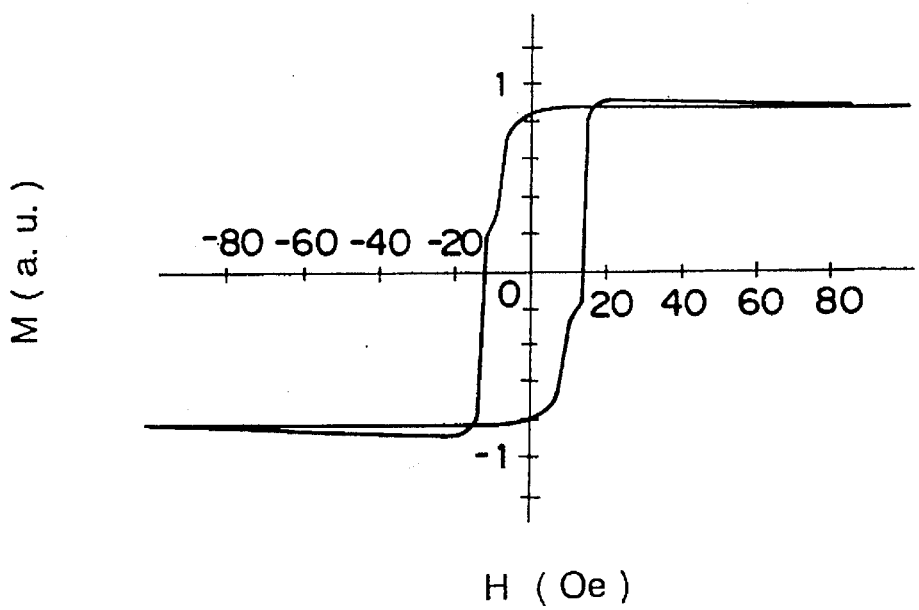
FIG. 11 illustrates a magnetization hysteresis curve of a sample 2-2 in Example 2.
Figure 12:
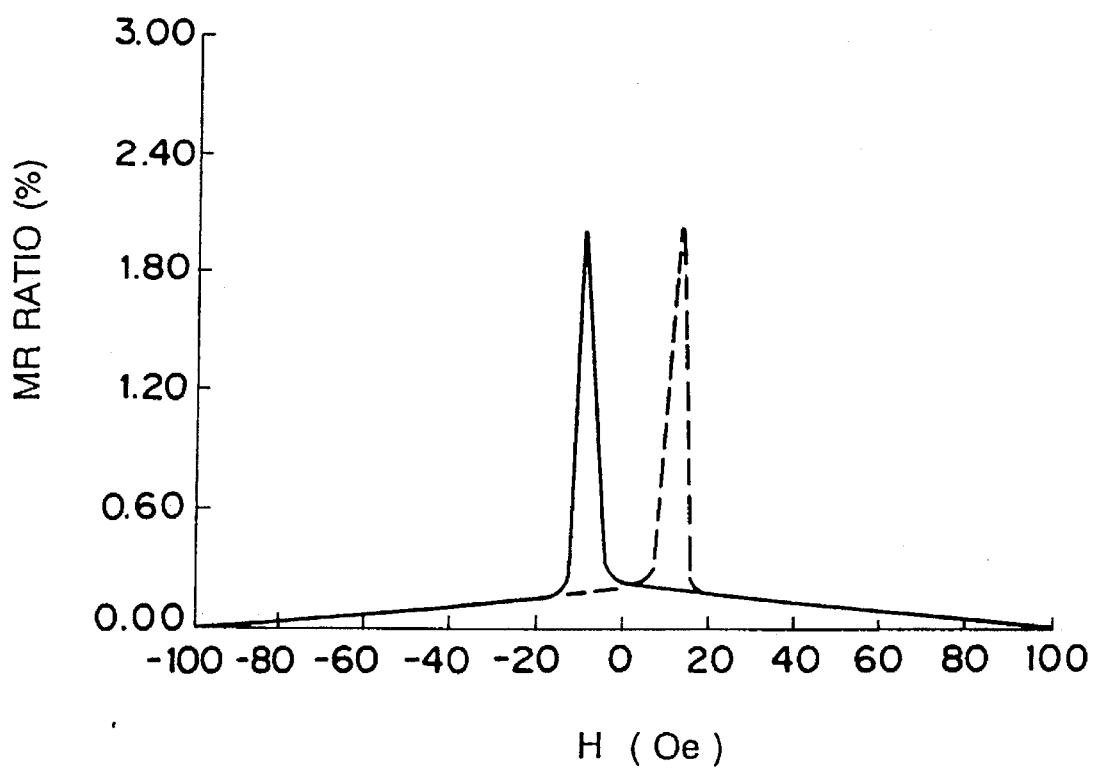
FIG. 12 illustrates magnetic field dependence of the MR ratio of the sample 2-2 in Example 2.

FIGS. 11 and 12 illustrate a hysteresis curve of the sample 2-2 (x=20 Å) and magnetic field dependence of the MR ratio respectively. As shown in FIG. 11, the hysteresis curve has necks and steep magnetization transition portions following the necks.

Figure 13:
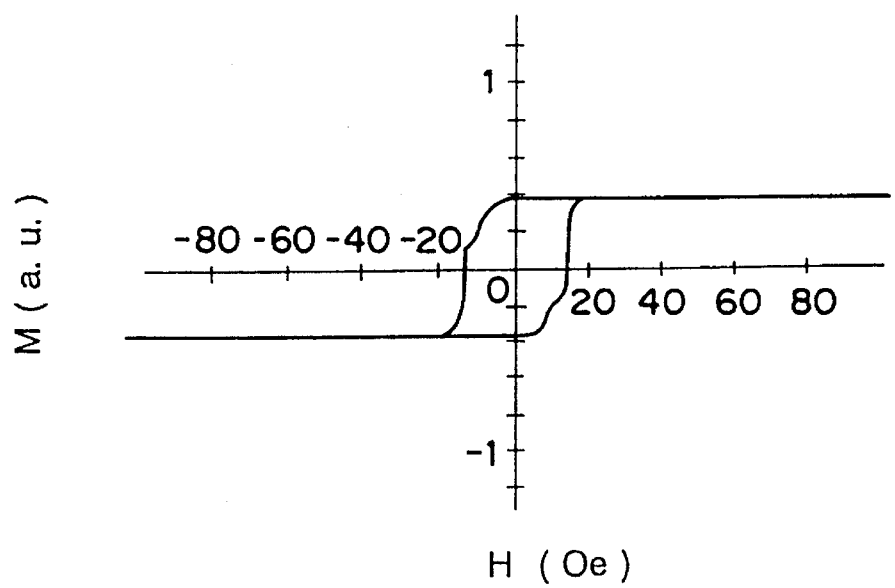
FIG. 13 illustrates a magnetization hysteresis curve of a sample 2-3 in Example 2.
Figure 14:
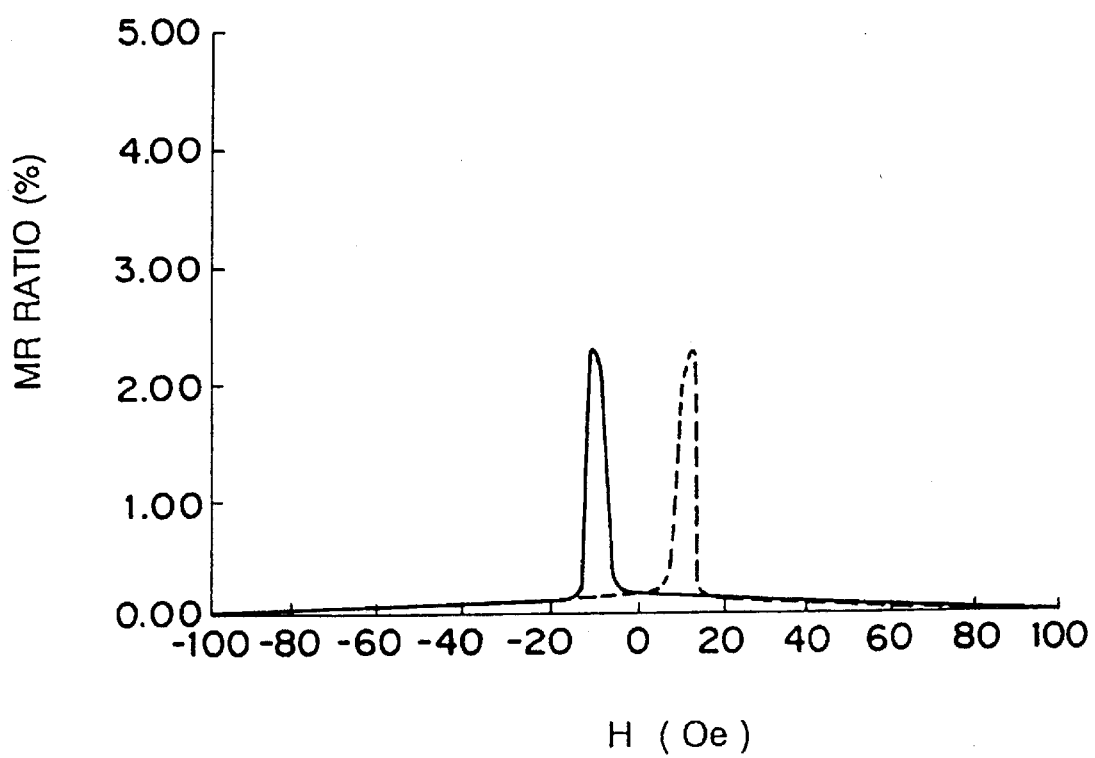
FIG. 14 illustrates magnetic field dependence of the MR ratio of the sample 2-3 in Example 2.

FIGS. 13 and 14 illustrate a hysteresis curve of the sample 2-3 (x=23 Å) and magnetic field dependence of the MR ratio respectively. As shown in FIG. 13, the hysteresis curve has necks and steep magnetization transition portions following the necks also in this sample. As shown in FIG. 14, further, the MR ratio was abruptly changed upon reduction thereof.

Figure 15:
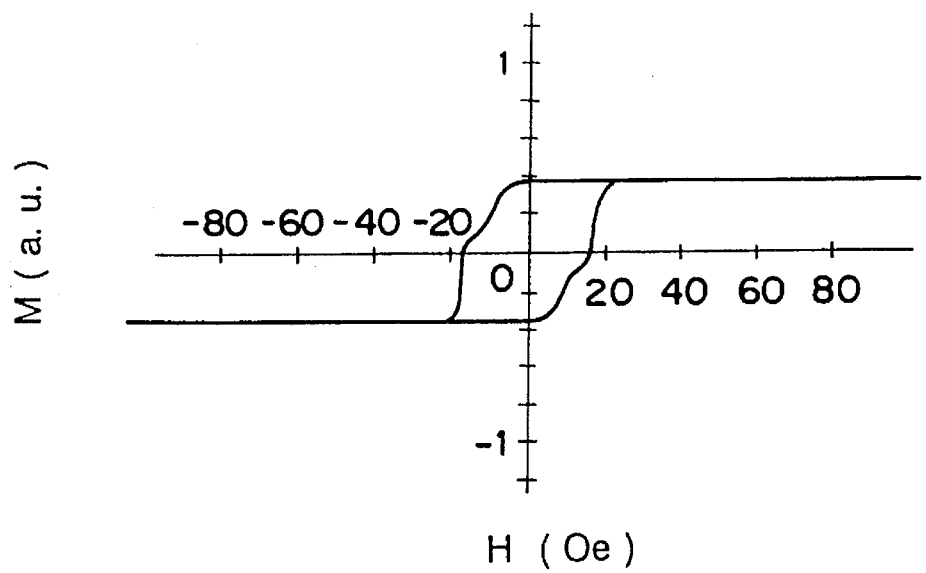
FIG. 15 illustrates a magnetization hysteresis curve of a sample 2-4 in Example 2.
Figure 16:
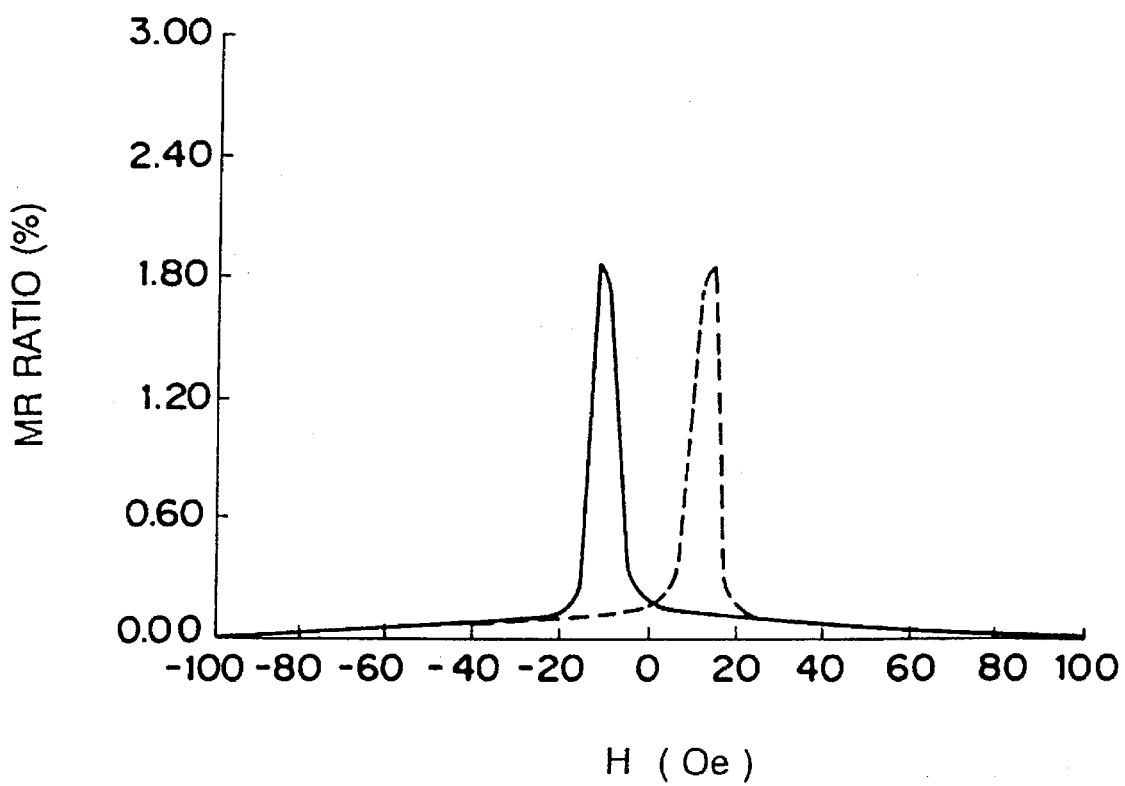
FIG. 16 illustrates magnetic field dependence of the MR ratio of the sample 2-4 in Example 2.

FIGS. 15 and 16 illustrate a hysteresis curve of the sample 2-4 (x=25 Å) and magnetic field dependence of the MR ratio respectively. As shown in FIG. 15, the hysteresis curve has necks and steep magnetization transition portions following the necks also in this sample. As shown in FIG. 16, further, the MR ratio was abruptly changed upon reduction thereof.

Figure 17:
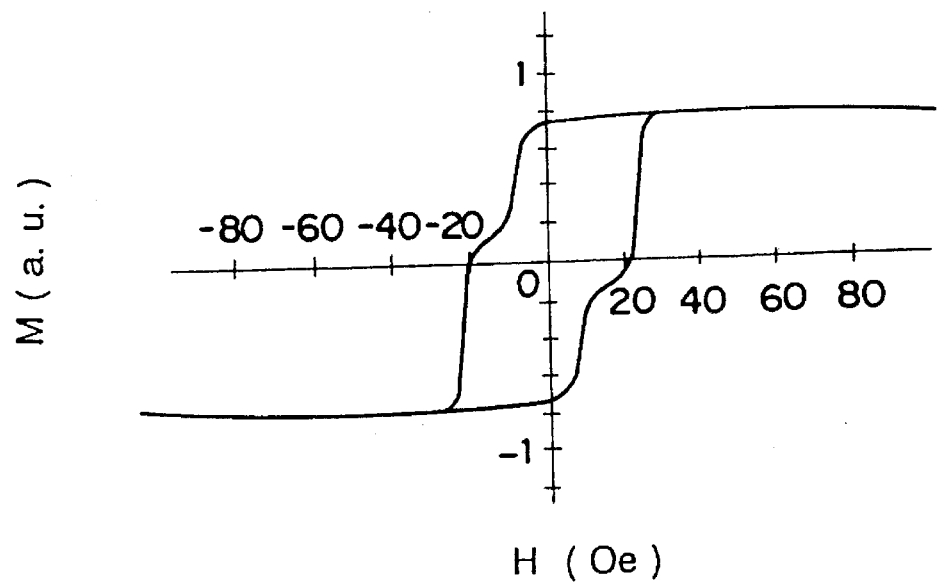
FIG. 17 illustrates a magnetization hysteresis curve of a sample 2-5 in Example 2.
Figure 18:
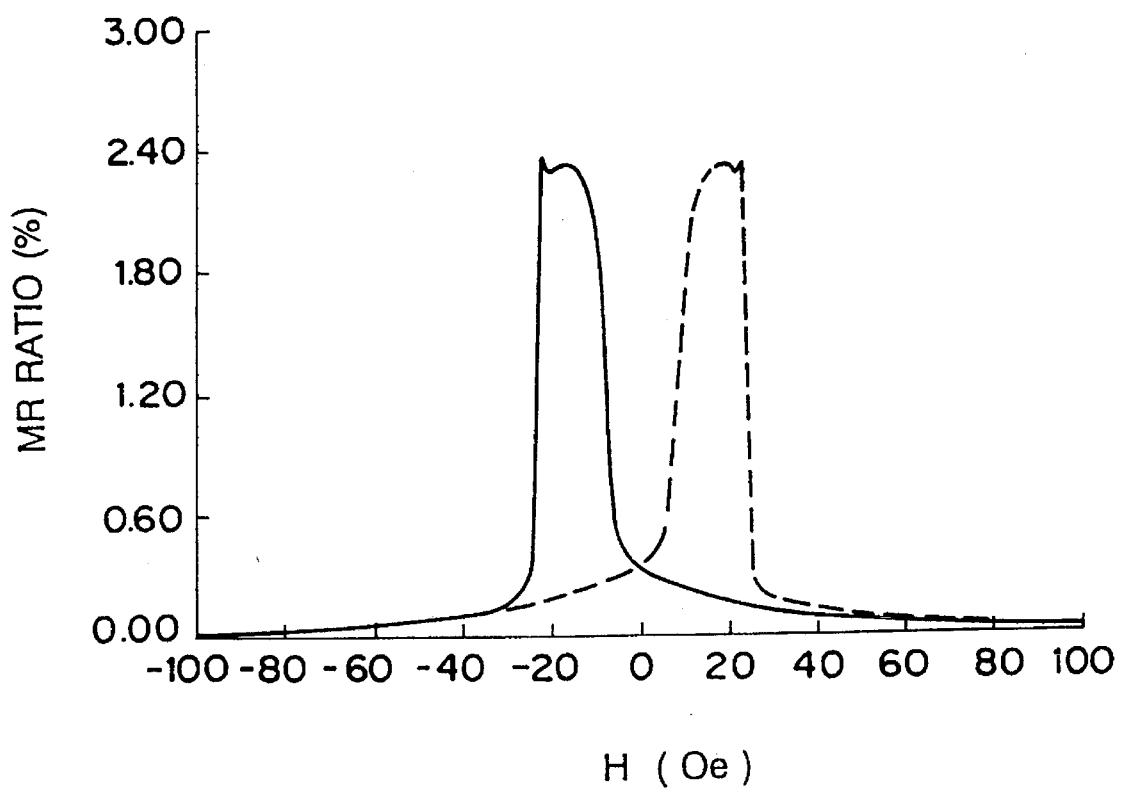
FIG. 18 illustrates magnetic field dependence of the MR ratio of the sample 2-5 in Example 2.

FIGS. 17 and 18 illustrate a hysteresis curve of the sample 2-5 (x=30 Å) and magnetic field dependence of the MR ratio respectively. As shown in FIG. 17, the hysteresis curve has necks and steep magnetization transition portions following the necks also in this sample. As shown in FIG. 18, further, the MR ratio was abruptly changed upon reduction thereof.

Figure 19:
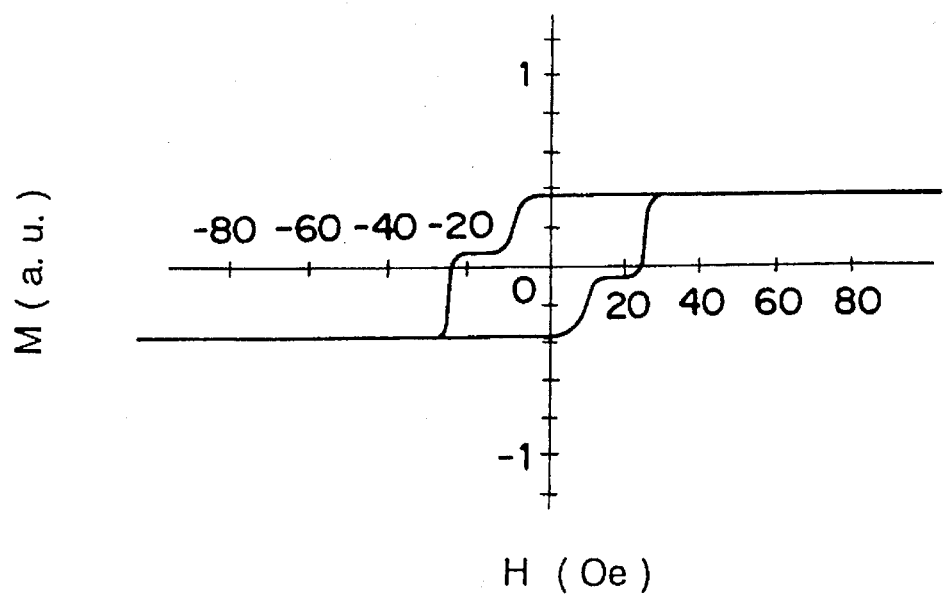
FIG. 19 illustrates a magnetization hysteresis curve of a sample 2-6 in Example 2.
Figure 20:
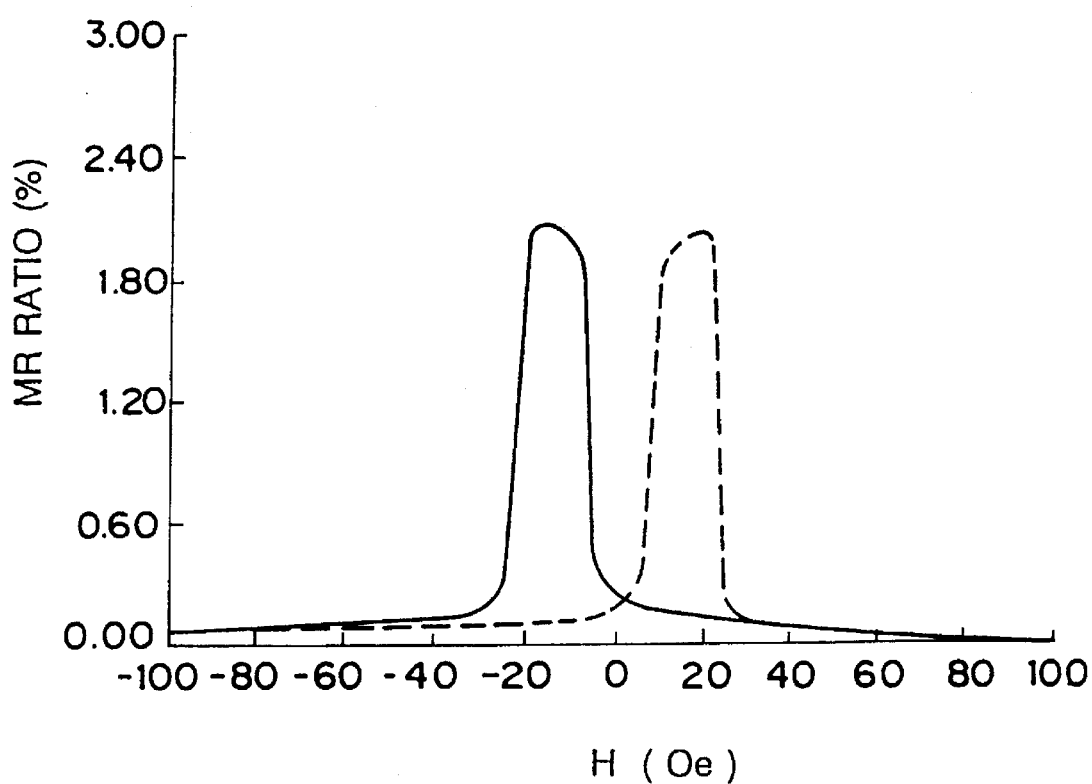
FIG. 20 illustrates magnetic field dependence of the MR ratio of the sample 2-6 in Example 2.

FIGS. 19 and 20 illustrate a hysteresis curve of the sample 2-6 (x=40 Å) and magnetic field dependence of the MR ratio respectively. As shown in FIG. 19, the hysteresis curve has necks and steep magnetization transition portions following the necks also in this sample. As shown in FIG. 20, further, the MR ratio was abruptly changed in reduction.

Figure 21:
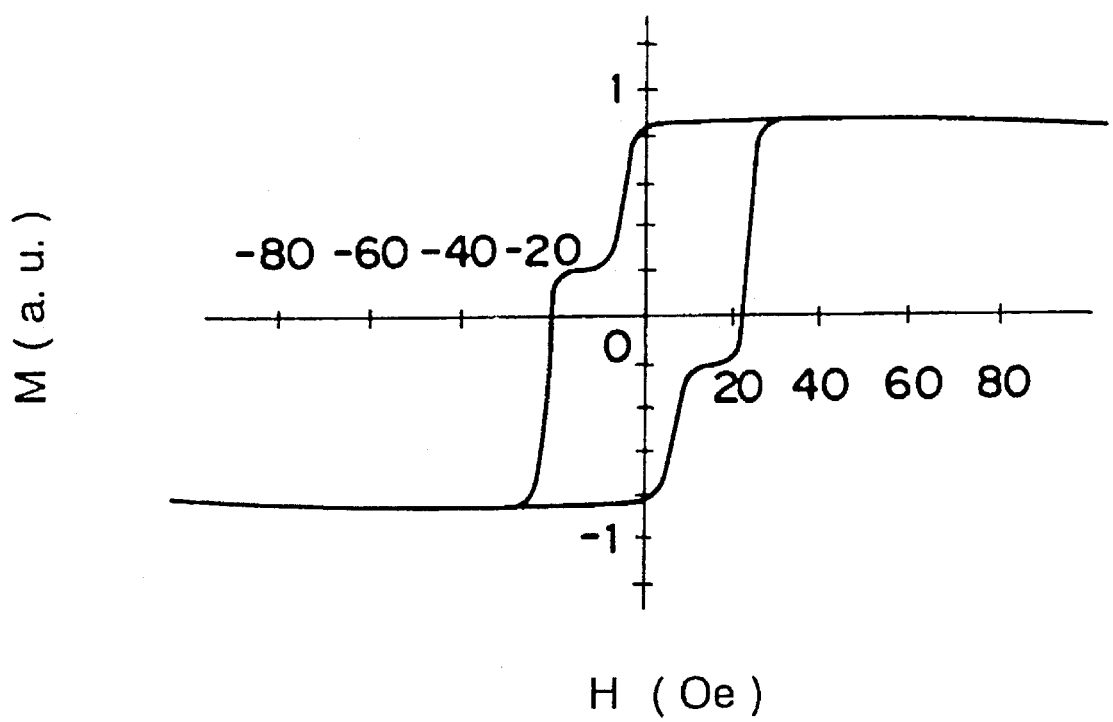
FIG. 21 illustrates a magnetization hysteresis curve of a sample 2-7 in Example 2.
Figure 22:
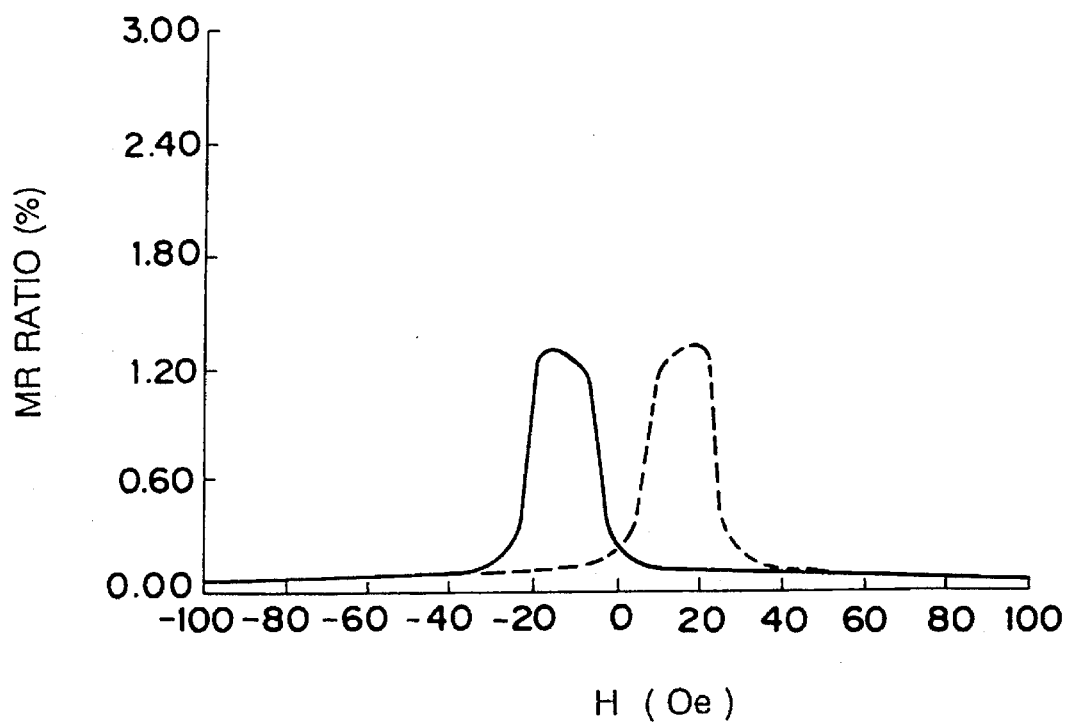
FIG. 22 illustrates magnetic field dependence of the MR ratio of the sample 2-7 in Example 2.

FIGS. 21 and 22 illustrate a hysteresis curve of the sample 2-7 (x=50 Å) and magnetic field dependence of the MR ratio respectively. As shown in FIG. 21, the hysteresis curve has necks and steep magnetization transition portions following the necks also in this sample. As shown in FIG. 22, further, the MR ratio was abruptly changed upon reduction thereof.

Figure 23:
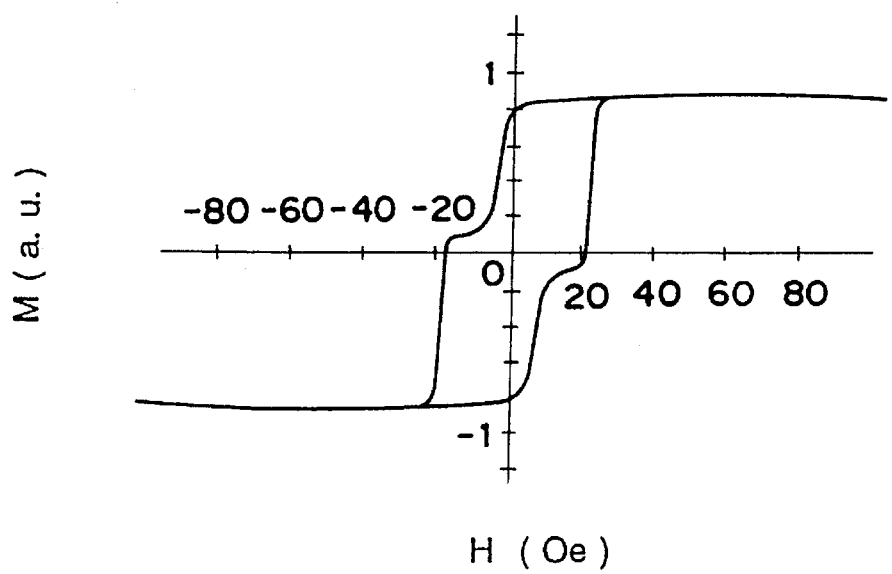
FIG. 23 illustrates a magnetization hysteresis curve of a sample 2-8 in Example 2.
Figure 24:
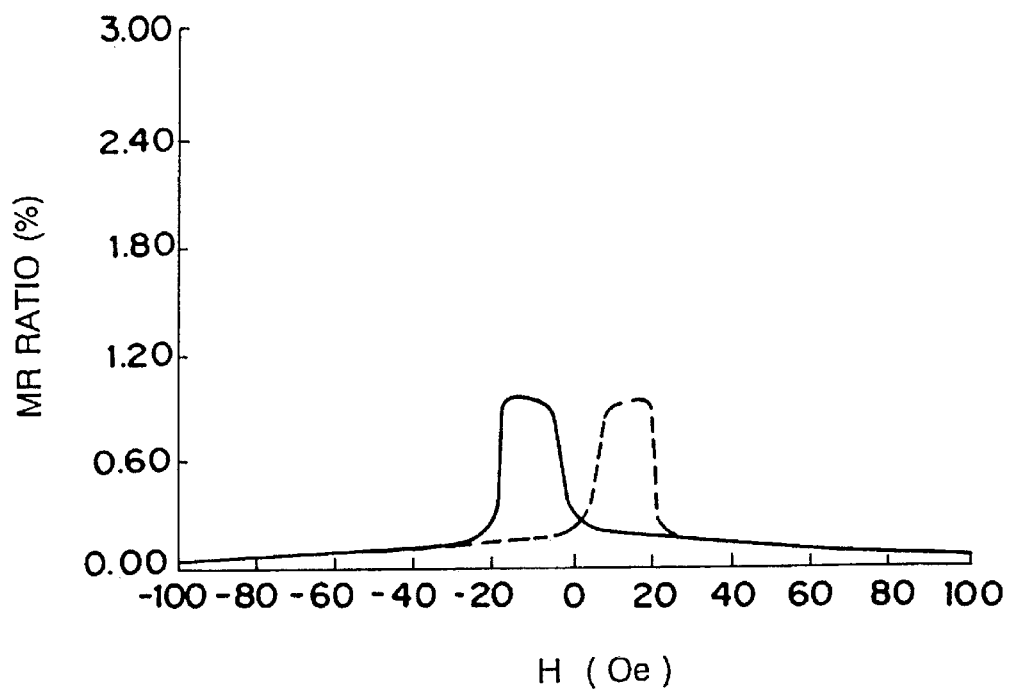
FIG. 24 illustrates magnetic field dependence of the MR ratio of the sample 2-8 in Example 2.

FIGS. 23 and 24 illustrate a hysteresis curve of the sample 2-8 (x=60 Å) and magnetic field dependence of the MR ratio respectively. As shown in FIG. 23, the hysteresis curve has necks and steep magnetization transition portions following the necks also in this sample. As shown in FIG. 24, further, the MR ratio was relatively abruptly changed upon reduction thereof.

Figure 25:
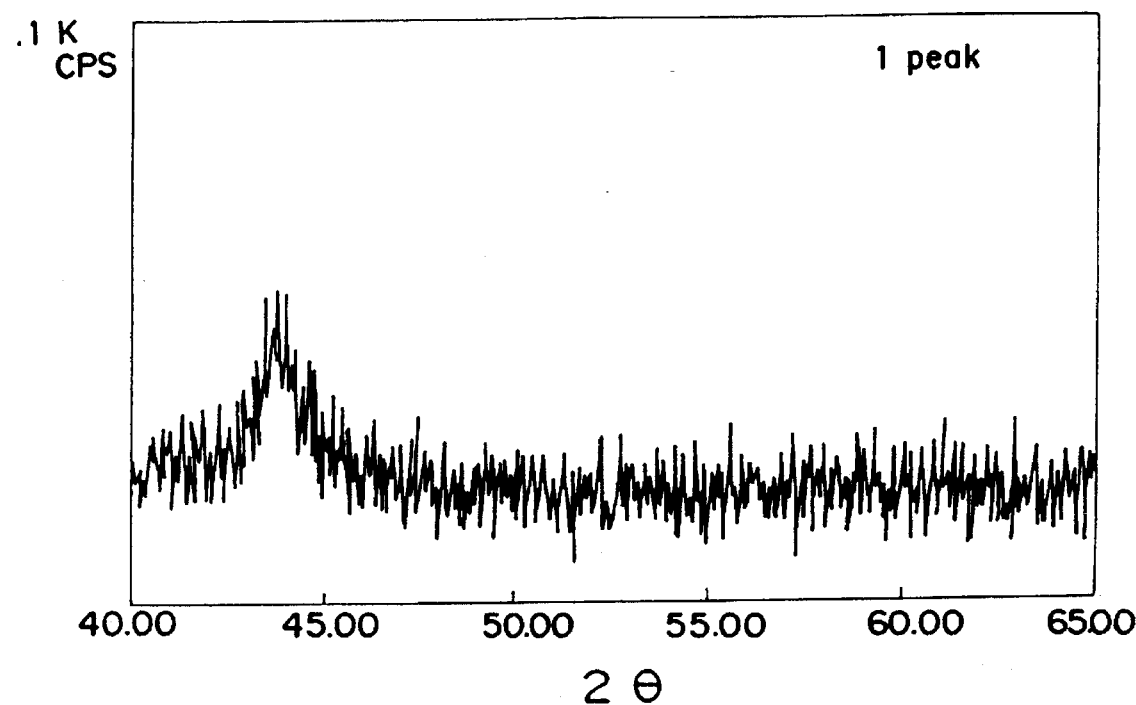
FIG. 25 illustrates an X-ray diffraction chart of the sample 2-3 in Example 2.
Figure 26:
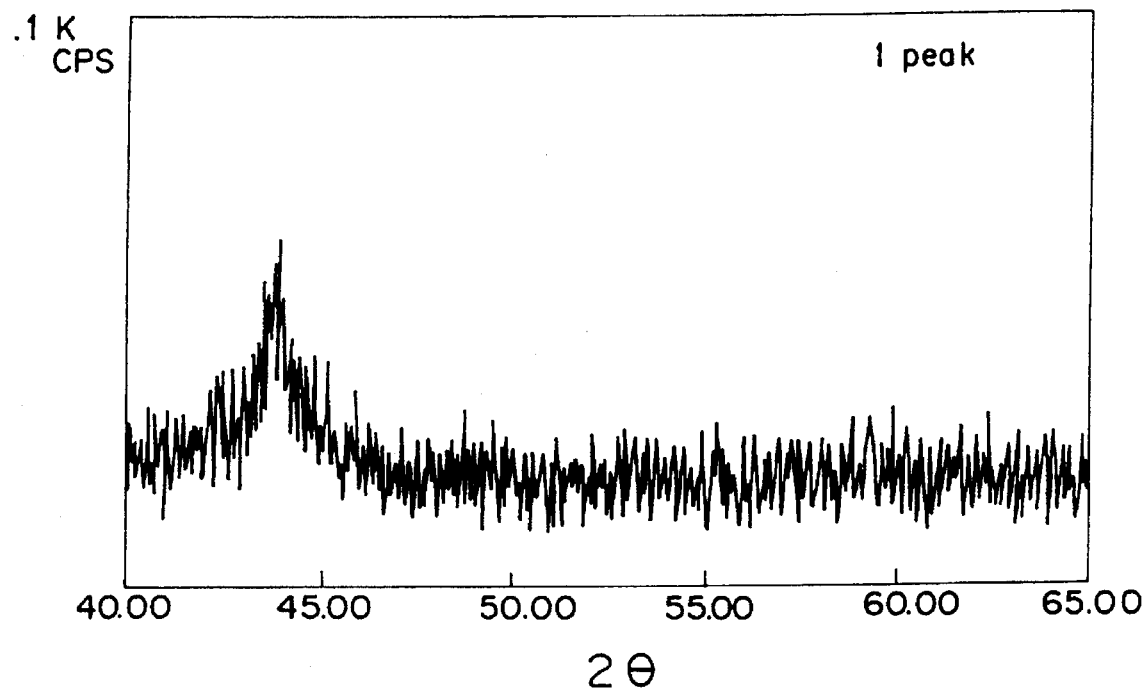
FIG. 26 illustrates an X-ray diffraction chart of the sample 2-5 in Example 2.
Figure 27:
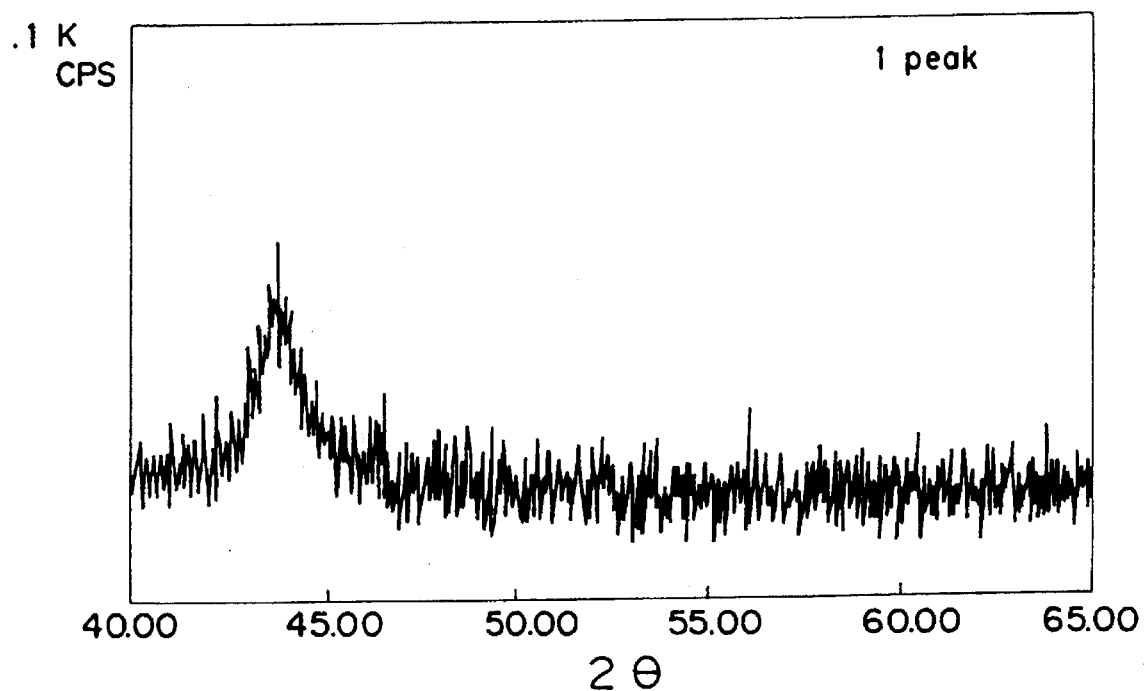
FIG. 27 illustrates an X-ray diffraction chart of the sample 2-6 in Example 2.

FIGS. 25, 26 and 27 illustrate X-ray diffraction charts of the sample 2-3 (x=23 Å), the sample 2-5 (x=30 Å) and the sample 2-6 (x=40 Å) respectively. As clearly understood from these X-ray diffraction charts, these samples have diffraction peaks in the vicinity of 43.8°. These diffraction peaks correspond to (111) planes of fcc structures. Thus, the multilayer films of these samples have fcc structures.

In the multilayer structure shown in FIG. 10, the glass substrate 1 was replaced by a silicon substrate, to prepare a magnetoresistive film having a Cu film 5 of 30 Å in thickness, i.e., x=30 Å.

Figure 28:
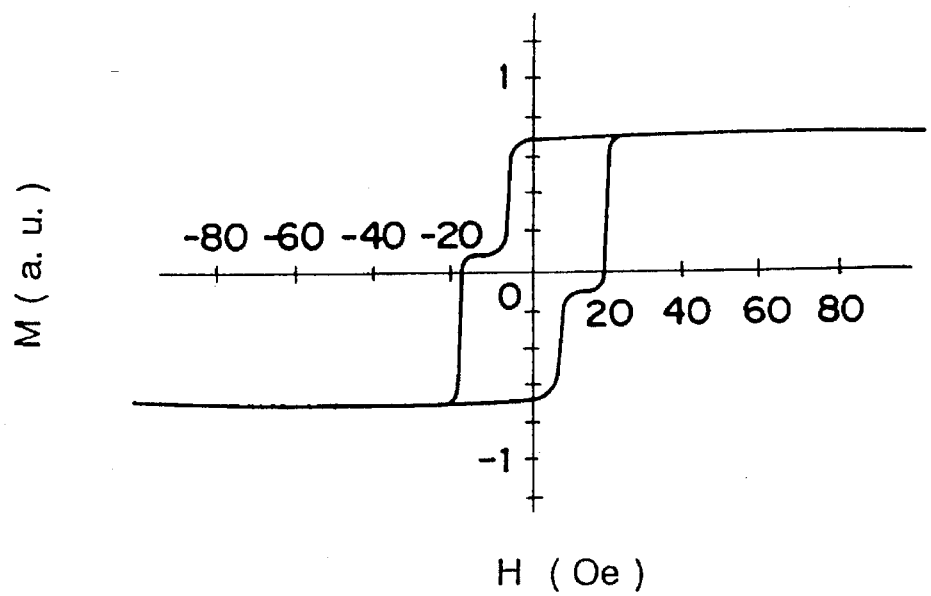
FIG. 28 illustrates a magnetization hysteresis curve of a sample 2-9 in Example 2.
Figure 29:
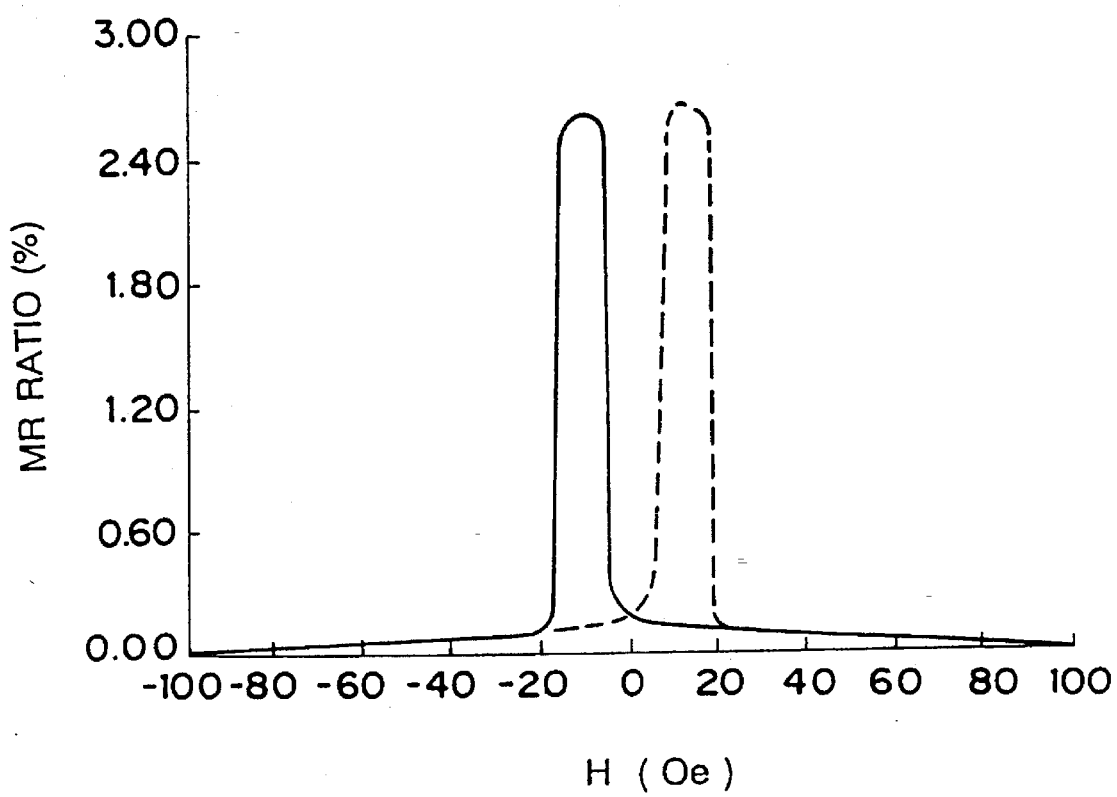
FIG. 29 illustrates magnetic field dependence of the MR ratio of the sample 2-9 in Example 2.

FIGS. 28 and 29 illustrate a hysteresis curve of the sample 2-9 (x=30 Å) obtained in this manner and magnetic field dependence of the MR ratio respectively. As shown in FIG. 28, the hysteresis curve has necks-and steep magnetization transition portions following the necks also in this sample.

This sample 2-9 had an MR ratio of 2.7%, and a magnetoresistance ratio per unit magnetic field of 1.2%/Oe.

Figure 30:
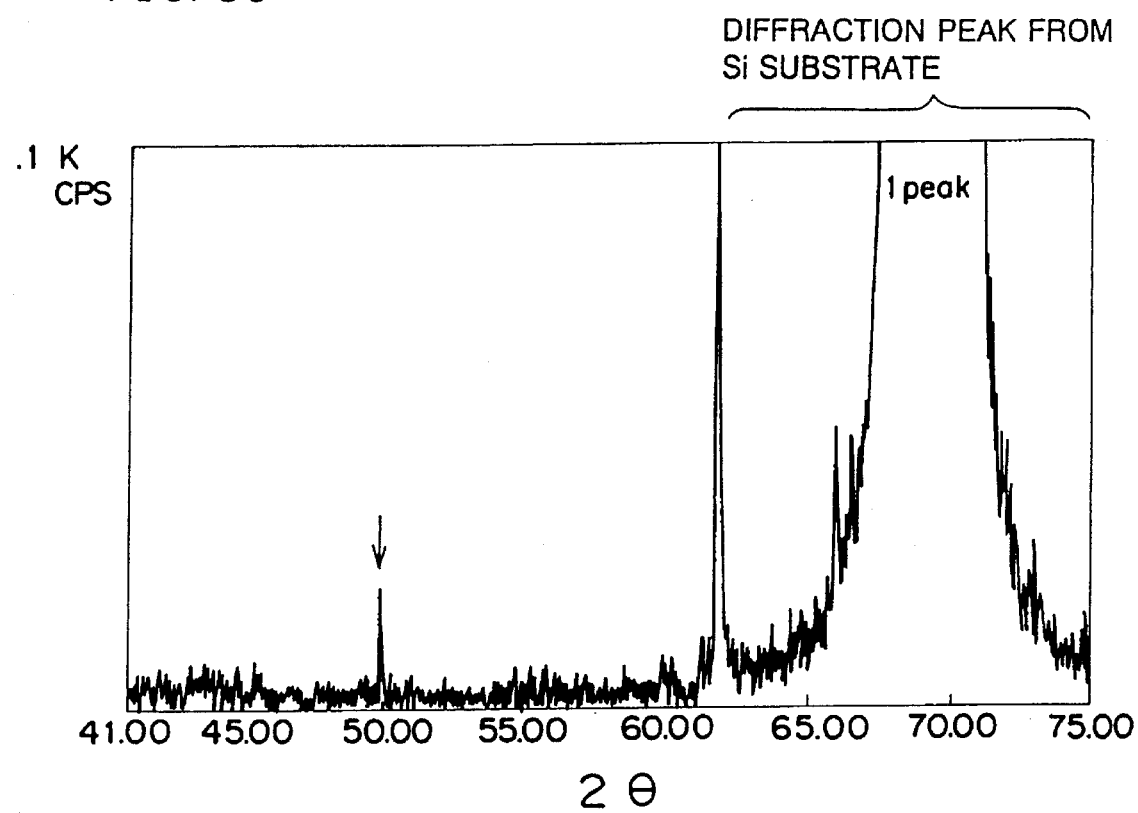
FIG. 30 illustrates an X-ray diffraction chart of the sample 2-9 in Example 2.

FIG. 30 illustrates an X-ray diffraction chart of the sample 2-9. As shown in FIG. 30, this sample has a diffraction peak in the vicinity of 50°. This diffraction peak corresponds to a (200) plane of an fcc structure. Thus, it is understood that this sample has the structure of fcc (200) orientation.

Comparative Example

Figure 31:
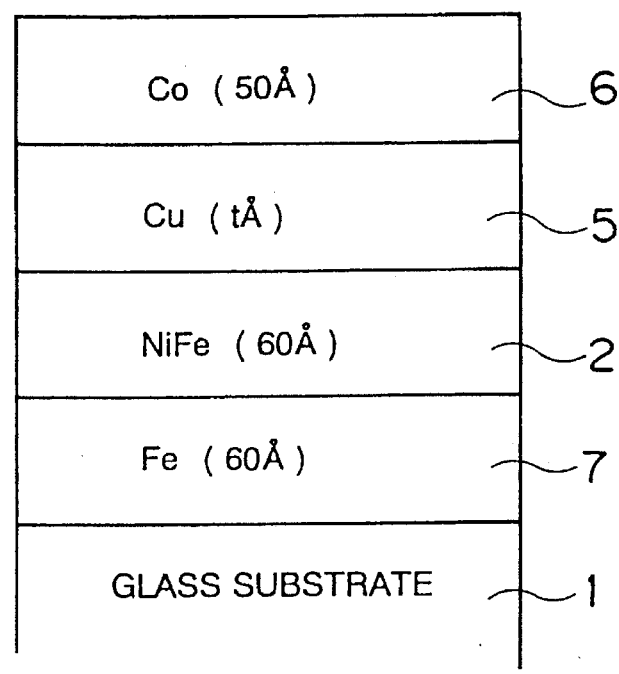
FIG. 31 is a typical sectional view showing the film structure of a multilayer film of comparative example.

A multilayer film having a structure shown in FIG. 31 was formed as a comparative example. Referring to FIG. 31, an Fe film 7, an NiFe film 2, a Cu film 5 and a Co film 6 having thicknesses of 60 Å, 60 Å, t Å and 50 Å respectively were successively formed and stacked on a glass substrate 1. The thickness t of the Cu film 5 was varied to 22 Å, 30 Å and 40 Å, to prepare samples 7-1, 7-2 and 7-3 respectively.

Figure 32:
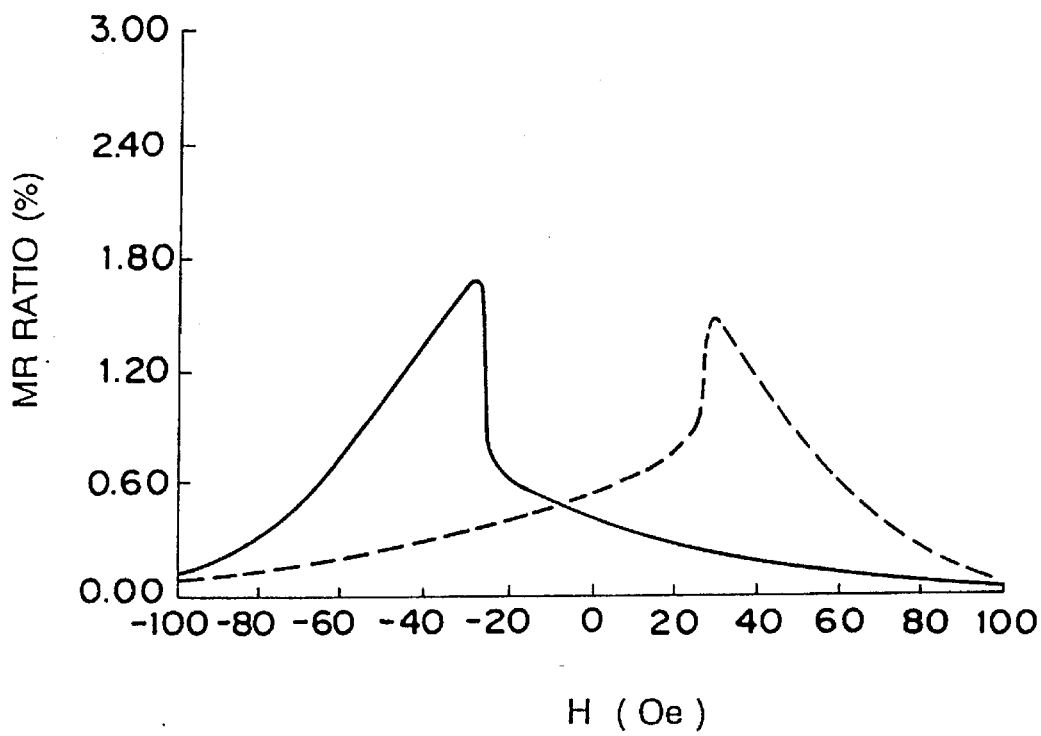
FIG. 32 illustrates magnetic dependence of the MR ratio of a sample 7-1 of comparative example.
Figure 33:
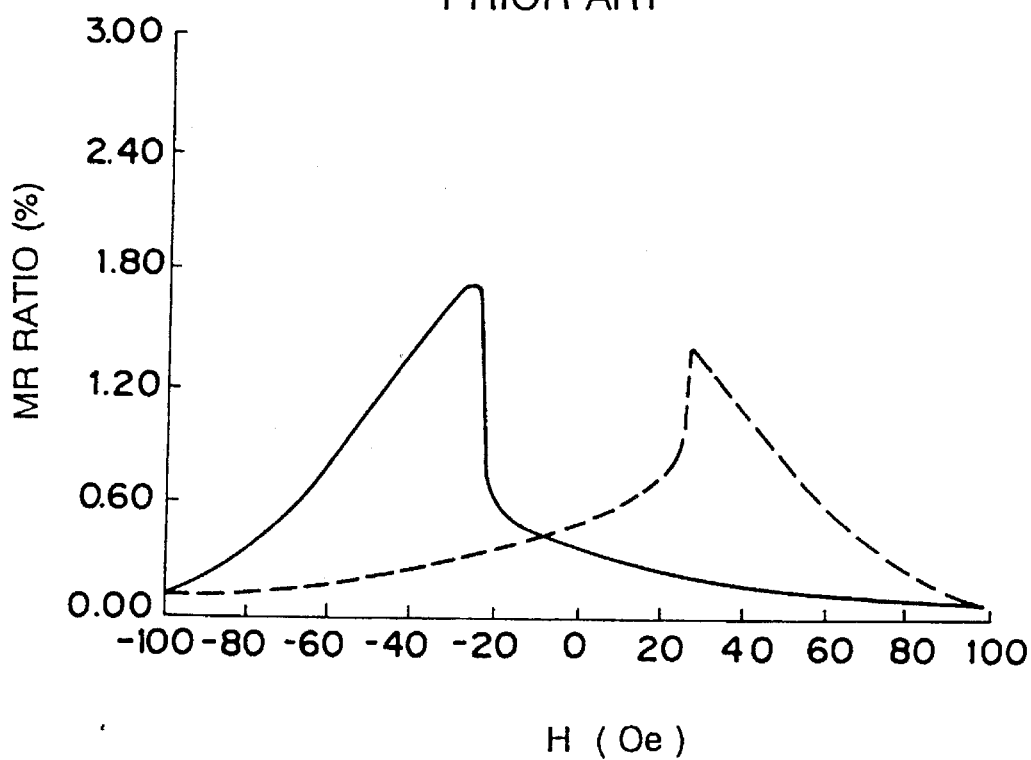
FIG. 33 illustrates magnetic dependence of the MR ratio of a sample 7-2 of comparative example.
Figure 34:
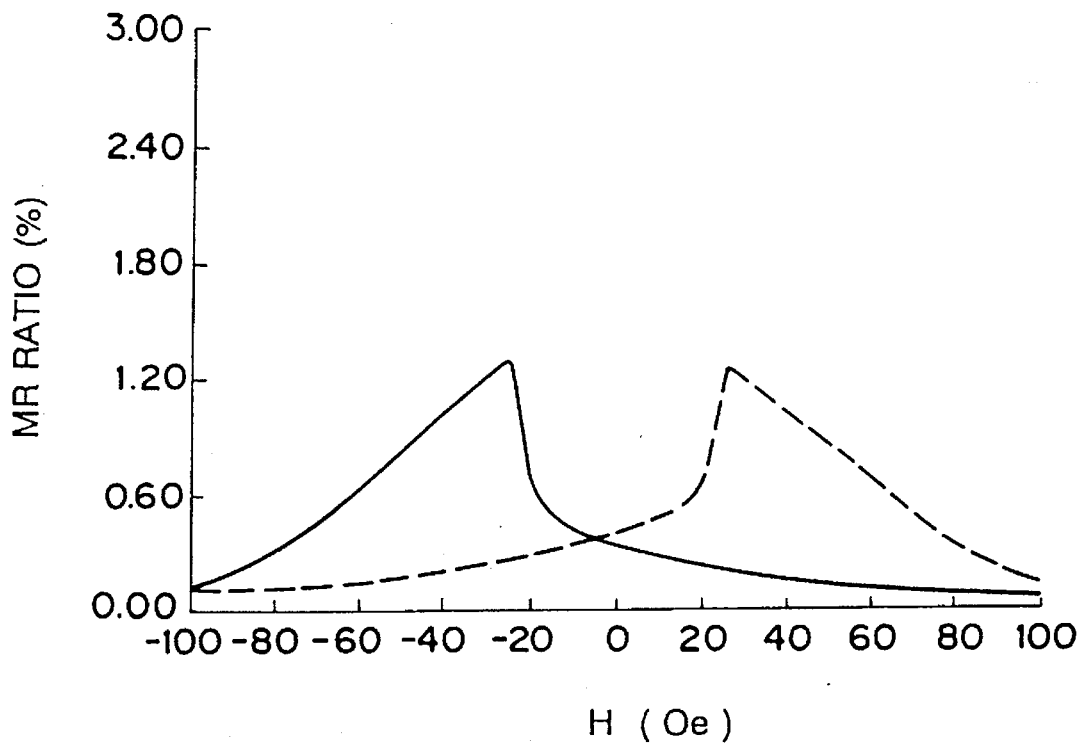
FIG. 34 illustrates magnetic dependence of the MR ratio of a sample 7-3 of comparative example.

FIGS. 32, 33 and 34 illustrate MR changes of the samples 7-1, 7-2 and 7-3 respectively. It is understood from FIGS. 32 to 34 that relatively steep MR changes are recognized in these samples in magnetization transition of the NiFe films 2 which are lower coercive force layers while the Co films 6 which are higher coercive force layers exhibit relatively gently sloped or less-steep magnetization transition with extremely inferior magnetic field sensitivity in particular.

Figure 35:
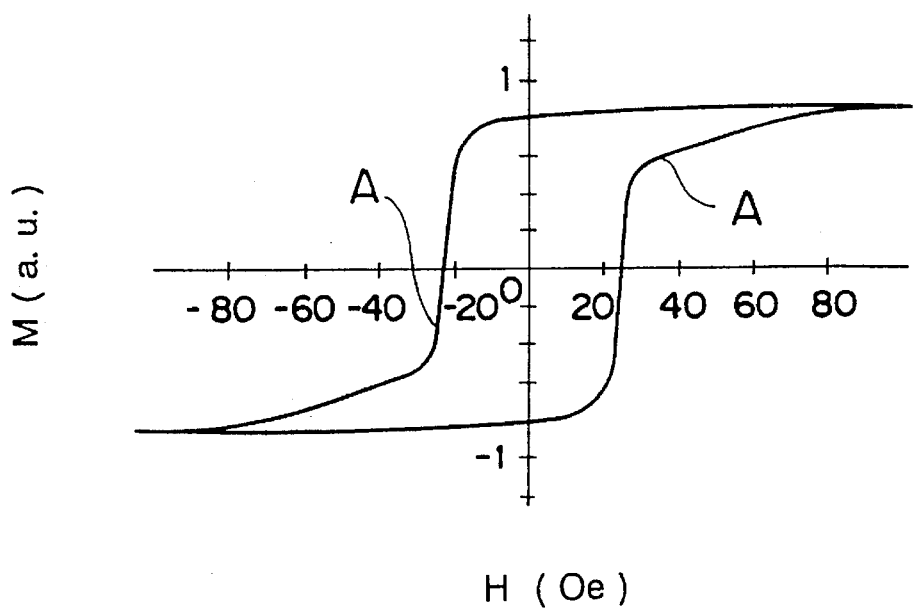
FIG. 35 illustrates a magnetization hysteresis curve of the sample 7-1 of comparative example.

FIG. 35 illustrates a hysteresis curve of the sample 7-1. As shown in FIG. 35, this sample 7-1 has necks A similarly to the respective samples according to Examples 1 and 2, but no steep magnetization transition portions follow these portions A. The hysteresis curve of FIG. 35 shows a change which is similar to that of a magnetoresistive film utilizing a spin valve effect through difference in coercive force, and conceivably corresponds to a magnetization process implementing parallel, antiparallel and parallel arrangement states in response to the strength of a magnetic field. The samples 7-2 and 7-3 exhibited curves which are similar to that shown in FIG. 35.

Figure 36:
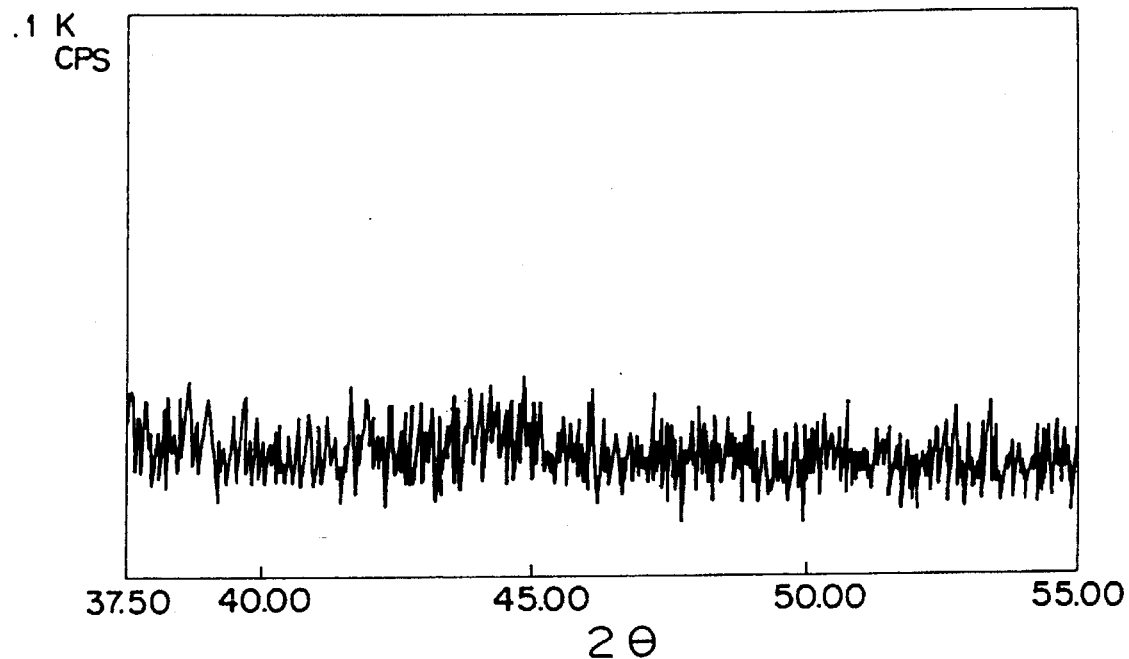
FIG. 36 illustrates an X-ray diffraction chart of the sample 7-1 of comparative example.
Figure 37:
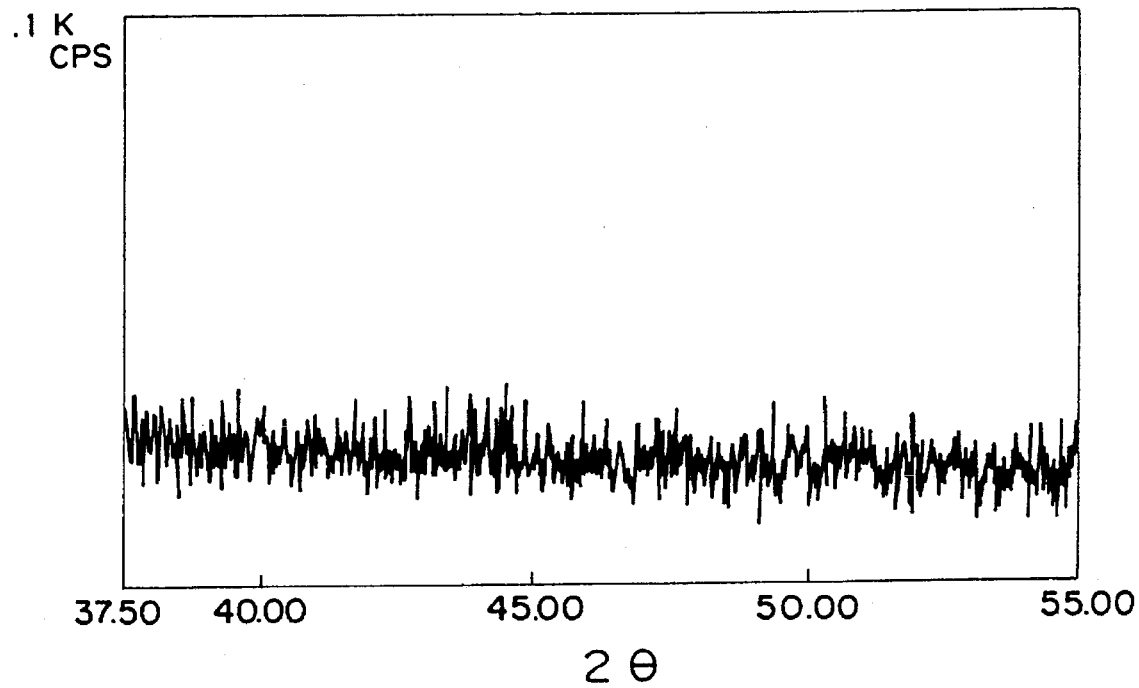
FIG. 37 illustrates an X-ray diffraction chart of the sample 7-2 of comparative example.
Figure 38:
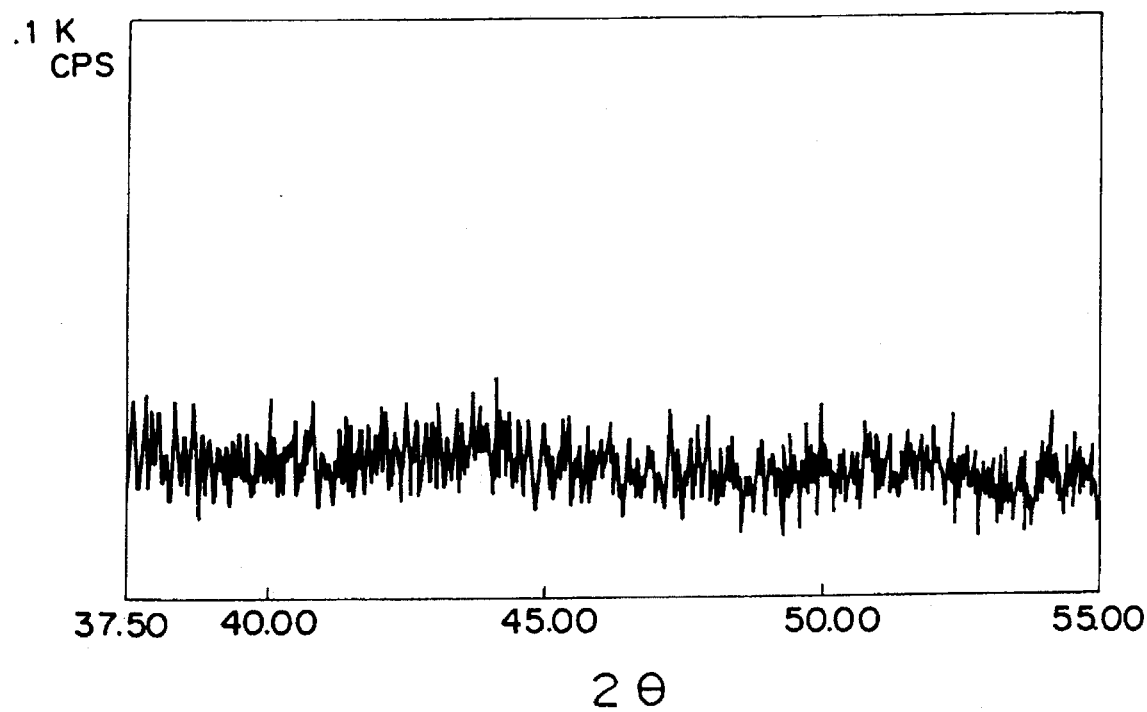
FIG. 38 illustrates an X-ray diffraction chart of the sample 7-3 of comparative example.

FIGS. 36, 37 and 38 illustrate X-ray diffraction charts of the samples 7-1, 7-2 and 7-3 respectively. As clearly understood from these figures, the samples 7-1 to 7-3 remained in amorphous states, without exhibiting clear diffraction peaks.

Table 3 shows magnetic field sensitivity levels (magnetoresistance ratio per unit magnetic field), MR ratios and crystallinity states of the comparative samples 7-1 to 7-3. For the purpose of comparison, Table 3 also shows data of the inventive samples 2-3, 2-5 and 2-6.

TABLE 3

| Sample No. | Cu Film Thickness (Å) | Magnetic Field Sensitivity (%/Oe) | MR Ratio (%) | Crystallinity |
|---|---|---|---|---|
| *7-1 | 22 | 0.19 | 1.7 | Non-oriented |
| *7-2 | 30 | 0.2 | 1.7 | Non-oriented |
| *7-3 | 40 | 0.14 | 1.3 | Non-oriented |
| 2-3 | 23 | 1.0 | 2.3 | fcc (111) |
| 2-5 | 30 | 0.7 | 2.4 | fcc (111) |
| 2-6 | 40 | 0.36 | 2.1 | fcc (111) |

*comparative sample

Comparative Sample

As shown in Table 3, magnetic field sensitivity levels of the comparative samples 7-1 to 7-3 are smaller than those of the inventive samples according to Example 2. This is conceivably because the samples 7-1 to 7-3 exhibited no changes, regarded as spin-flop transition, following the necks of the hysteresis curves. Further, the samples 7-1 to 7-3 had no fcc structures and remained in the amorphous states. Thus, it is conceivable that a magnetic action hardly take place between the first and second ferromagnetic layers in each of these samples. In this case, therefore, it is conceivable that no change of the magnetization process is caused in correspondence to the spin-flop transition of the present invention. While the reason why no fcc structures were formed in the samples 7-1 to 7-3 has not yet been clarified in detail, it is conceivable that Fe films were temporarily formed on the glass substrates such that films stacked thereon hardly formed fcc structures due to presence of the Fe films.

Example 3

Figure 39:
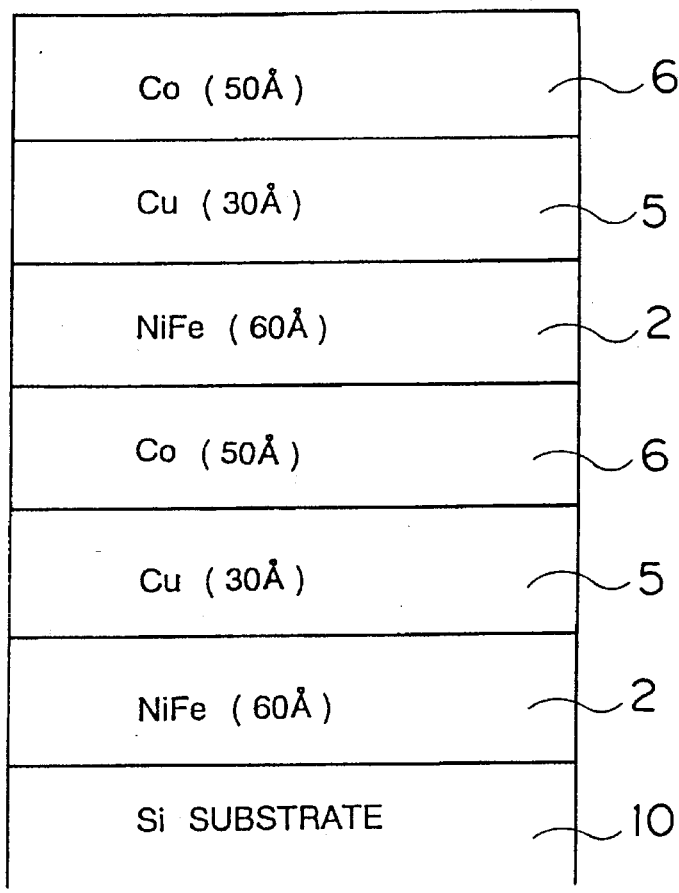
FIG. 39 is a typical sectional view showing the film structure of a multilayer film according to Example 3 of the present invention.

A magnetoresistive film having a multilayer structure shown in FIG. 39 was prepared. Referring to FIG. 39, an NiFe film 2, a Cu film 5 and a Co film 6 were formed on a silicon substrate 10. Further, a multilayer structure of another NiFe film 2, another Cu film 5 and another Co film 6 was repeatedly formed thereon. The thicknesses of each NiFe film 2, each Cu film 5 and each Co film 6 were 60 Å, 30 Å and 50 Å respectively.

Figure 40:
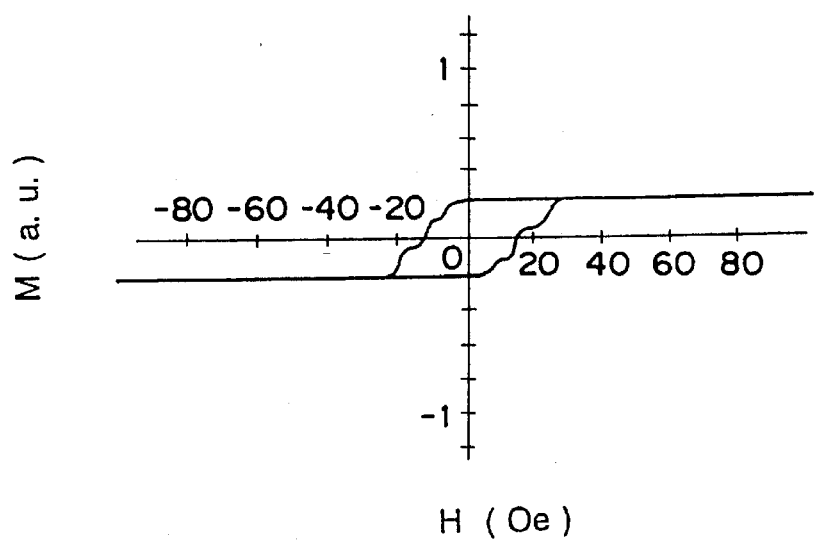
FIG. 40 illustrates a magnetization hysteresis curve of Example 3.

FIG. 40 illustrates a hysteresis curve of the magnetoresistive film obtained in the aforementioned manner. As shown in FIG. 40, this hysteresis curve has two necks, and steep magnetization transition portions following the necks.

Figure 41:
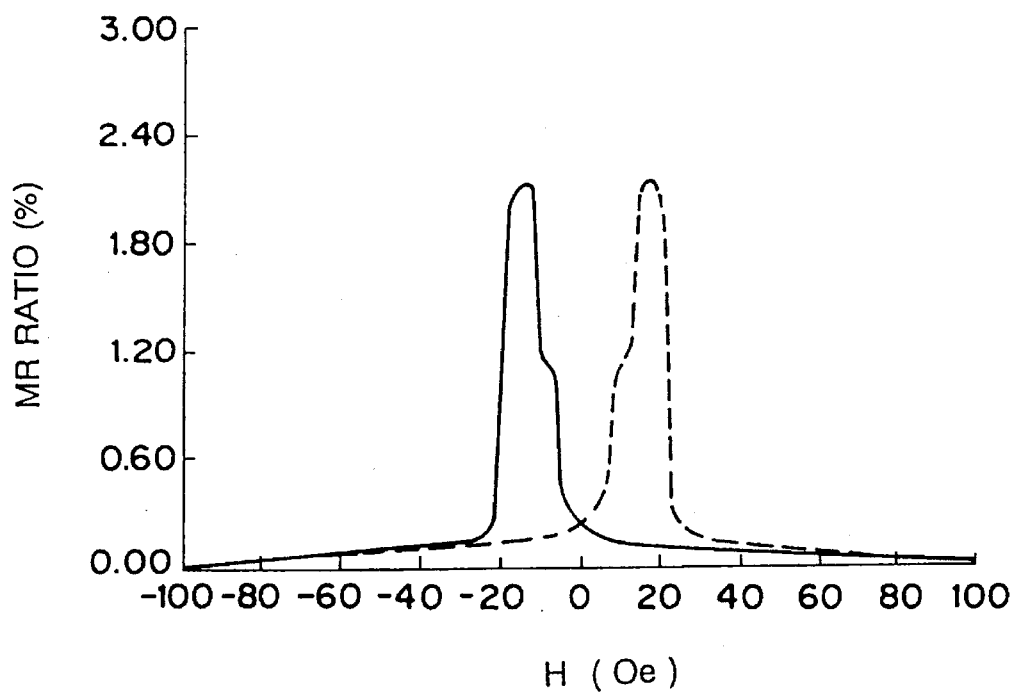
FIG. 41 illustrates magnetic field dependence of the MR ratio of Example 3.

FIG. 41 illustrates magnetic field dependence of the MR ratio of the magnetoresistive film shown in FIG. 39. As shown in FIG. 41, the MR ratio exhibited an abrupt MR change upon reduction thereof.

Figure 42:
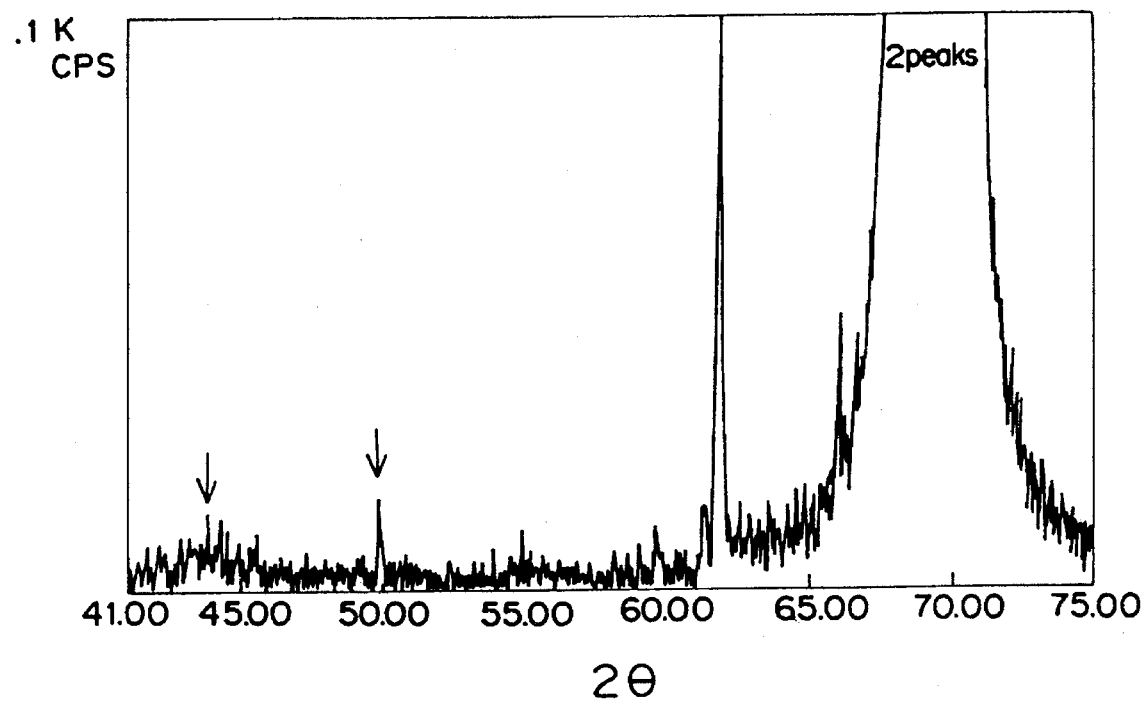
FIG. 42 illustrates an X-ray diffraction chart of Example 3.

FIG. 42 illustrates an X-ray diffraction pattern of the magnetoresistive film shown in FIG. 39. As shown in FIG. 42, diffraction peaks are recognized at 43.8° and 50°. These peaks correspond to (111) and (200) planes of an fcc structure. It is conceivable that crystal orientation of an fcc(111) plane and that of an fcc(200) plane are mixed with each other.

In this magnetoresistive film of this Example, the MR ratio was 2.1%, and the magnetoresistance ratio per unit magnetic field was 0.57%/Oe. Thus, it is understood possible to attain a high MR ratio and high magnetic field sensitivity in the inventive magnetoresistive film also when a plurality of sandwich structure films consisting of first and second ferromagnetic layers which are partitioned by nonmagnetic metal films are stacked with each other.

Example 4

Figure 43:
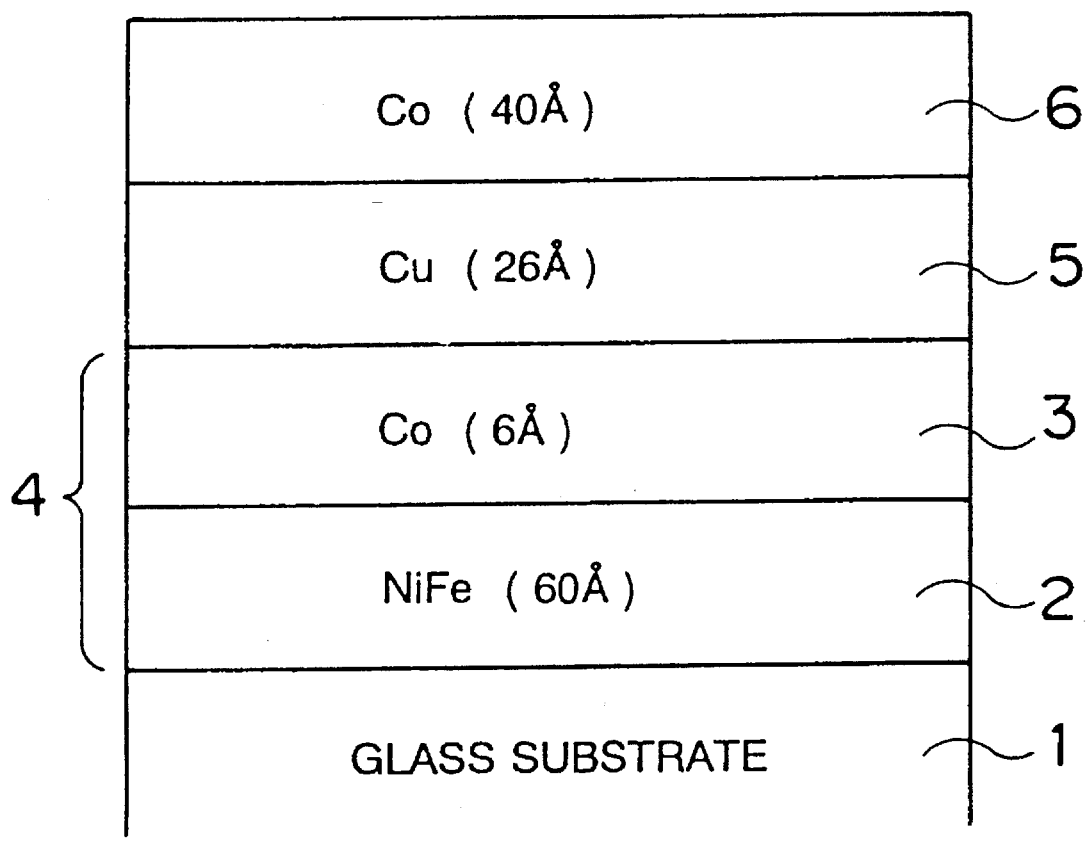
FIG. 43 is a typical sectional view showing the film structure of a multilayer film according to Example 4 of the present invention.

A magnetoresistive film having a multilayer structure shown in FIG. 43 was prepared. Referring to FIG. 43, an NiFe film 2 and a Co film 3 defining a first ferromagnetic layer 4 were formed on a glass substrate 1, while a Cu film 5 and a Co film 6 were formed thereon for serving as a non-magnetic metal film and a second ferromagnetic layer respectively. The thicknesses of the NiFe film 2, the Co film 3, the Cu film 5 and the Co film 6 were 60 Å, 6 Å, 26 Å and 40 Å respectively.

Figure 44:
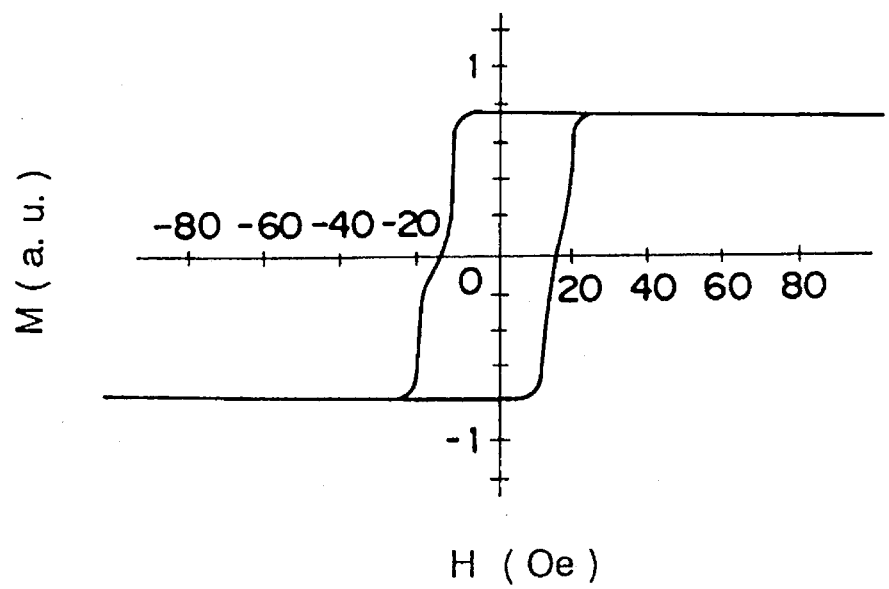
FIG. 44 illustrates a magnetization hysteresis curve of Example 4.

FIG. 44 illustrates a hysteresis curve of the magnetoresistive film shown in FIG. 43. It is understood that the hysteresis curve has necks and steep magnetization transition portions following the necks.

Figure 45:
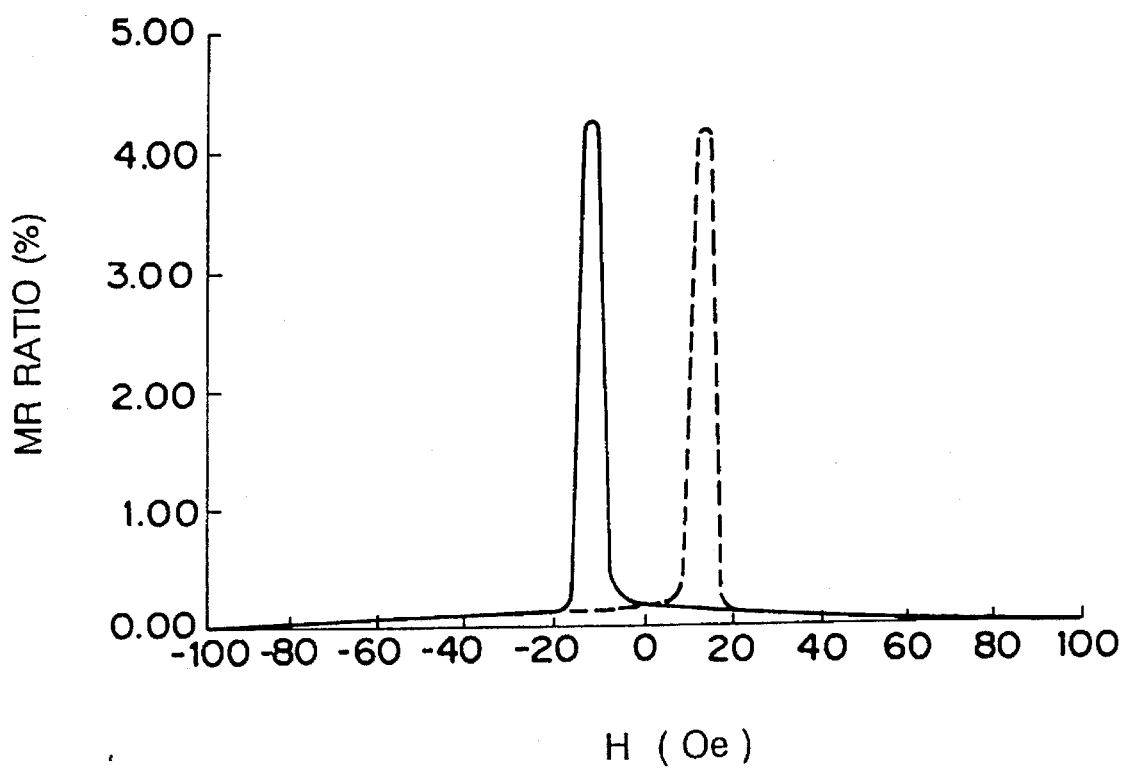
FIG. 45 illustrates magnetic field dependence of the MR ratio of Example 4.

FIG. 45 illustrates magnetic field dependence of the MR ratio of the magnetoresistive film shown in FIG. 43. It is understood that the MR change exhibited an abrupt MR change upon reduction thereof.

In the magnetoresistive film according to this Example, the MR ratio was 4.2%, and the magnetoresistance ratio per unit magnetic field was 1.0%/Oe.

Example 5

Figure 46:
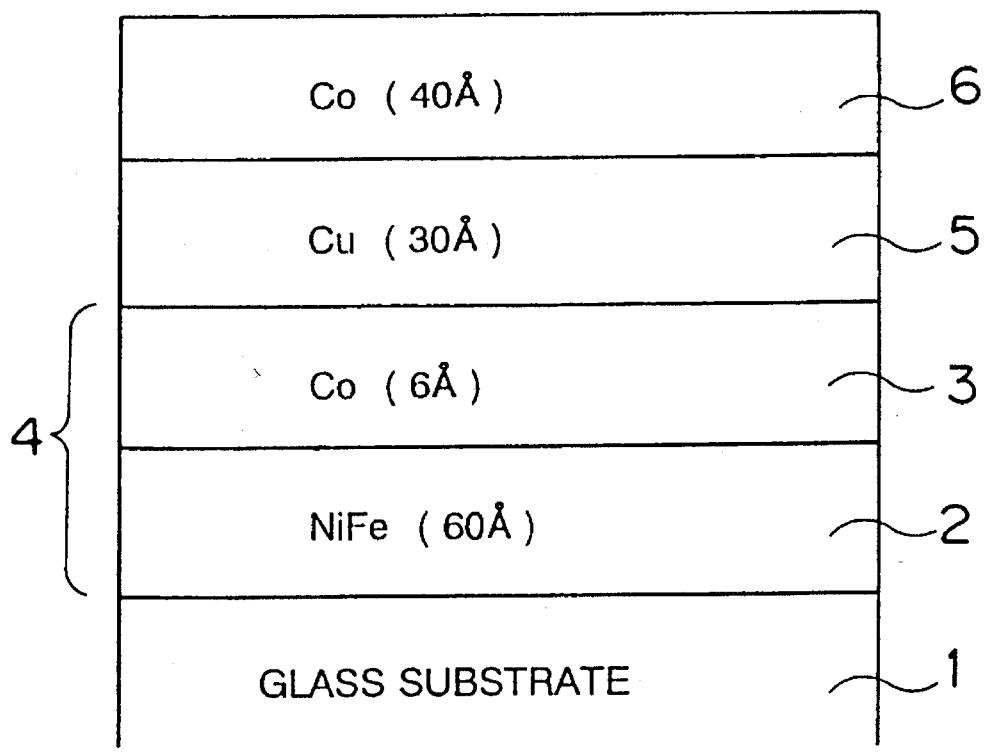
FIG. 46 is a typical sectional view showing the film structure of a multilayer film according to Example 5 of the present invention.
Figure 47:
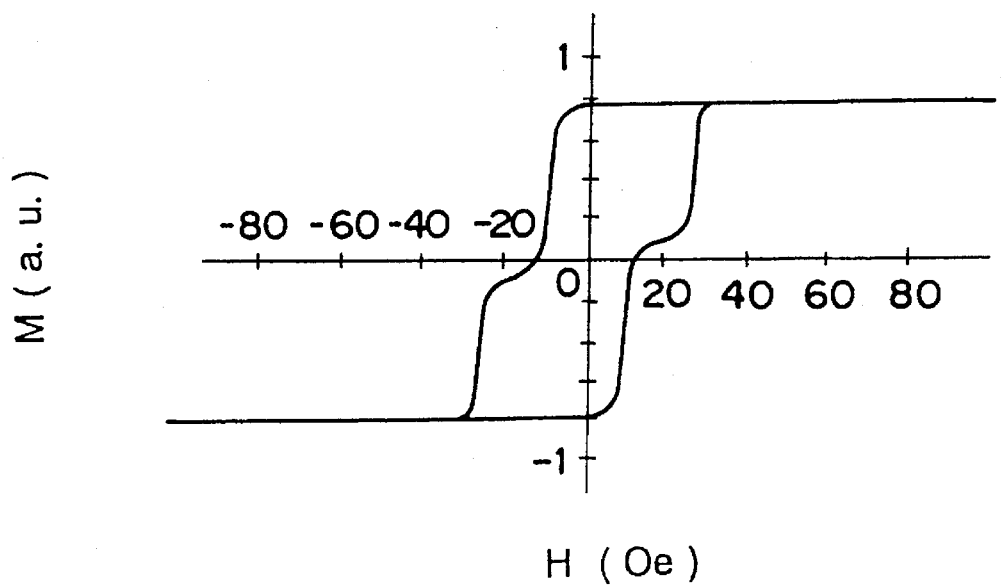
FIG. 47 illustrates a magnetization hysteresis curve of Example 5.

A magnetoresistive film having a multilayer structure shown in FIG. 46 was prepared. This multilayer film was similar to that of Example 4, except that the thickness of a Cu film 5 was 30 Å. FIG. 47 illustrates a hysteresis curve of the magnetoresistive film shown in FIG. 46. This hysteresis curve has necks and steep magnetization transition portions following the necks.

Figure 48:
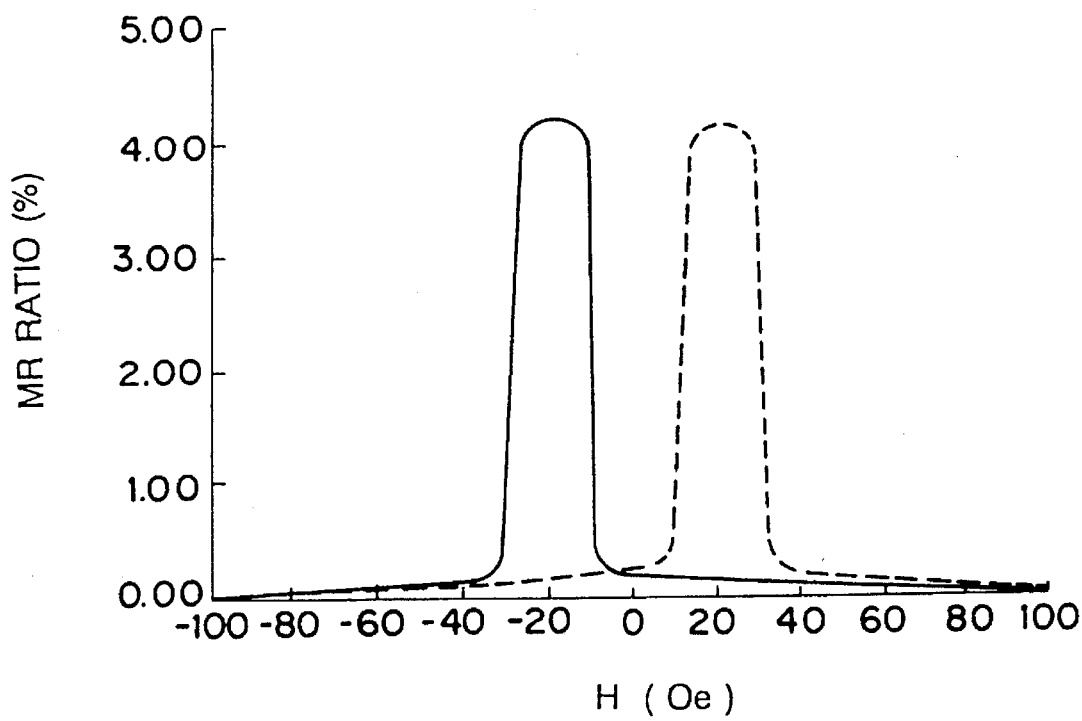
FIG. 48 illustrates magnetic field dependence of the MR ratio of Example 5.

FIG. 48 illustrates magnetic field dependence of the MR ratio of the magnetoresistive film shown in FIG. 46.

In the magnetoresistive film of this Example, the MR ratio was 4.2%, and the magnetoresistance ratio per unit magnetic field was 1.75%/Oe.

Example 6

Figure 49:
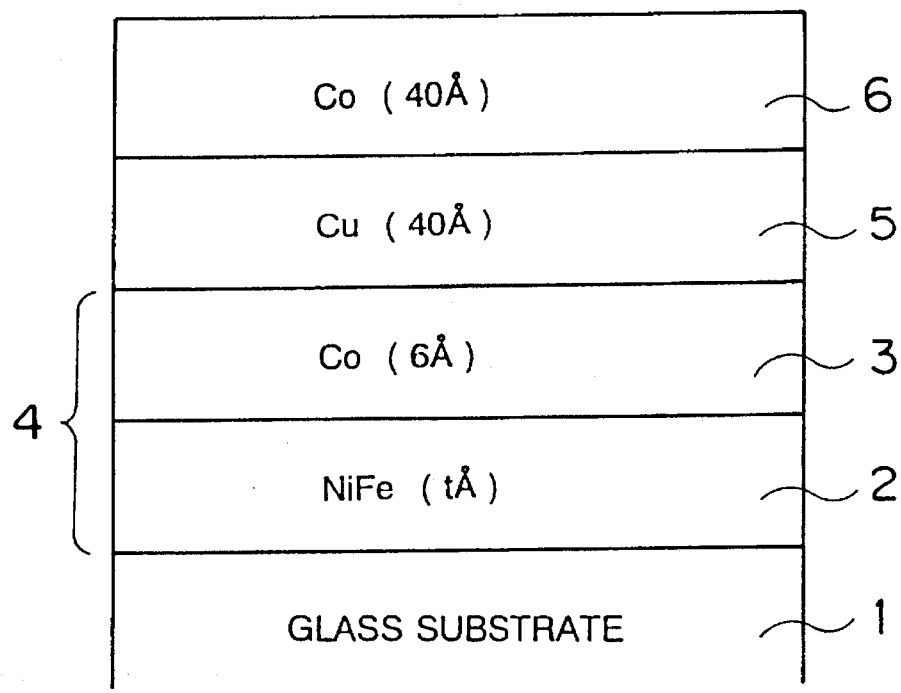
FIG. 49 is a typical sectional view showing the film structure of a multilayer film according to Example 6 of the present invention.

Thicknesses of NiFe films forming first ferromagnetic layers were varied to study influences exerted on MR ratios and magnetic field sensitivity levels. Samples of a magnetoresistive film having a multilayer structure shown in FIG. 49 were prepared. The thicknesses of a Co film 3, a Cu film 5 and another Co film 6 were 6 Å, 40 Å and 40 Å respectively. The thickness of an NiFe film 2 was varied to 20, 30, 40, 50, 60, 80, 100 and 120 Å, to prepare samples having NiFe films of different thicknesses.

Figure 50:
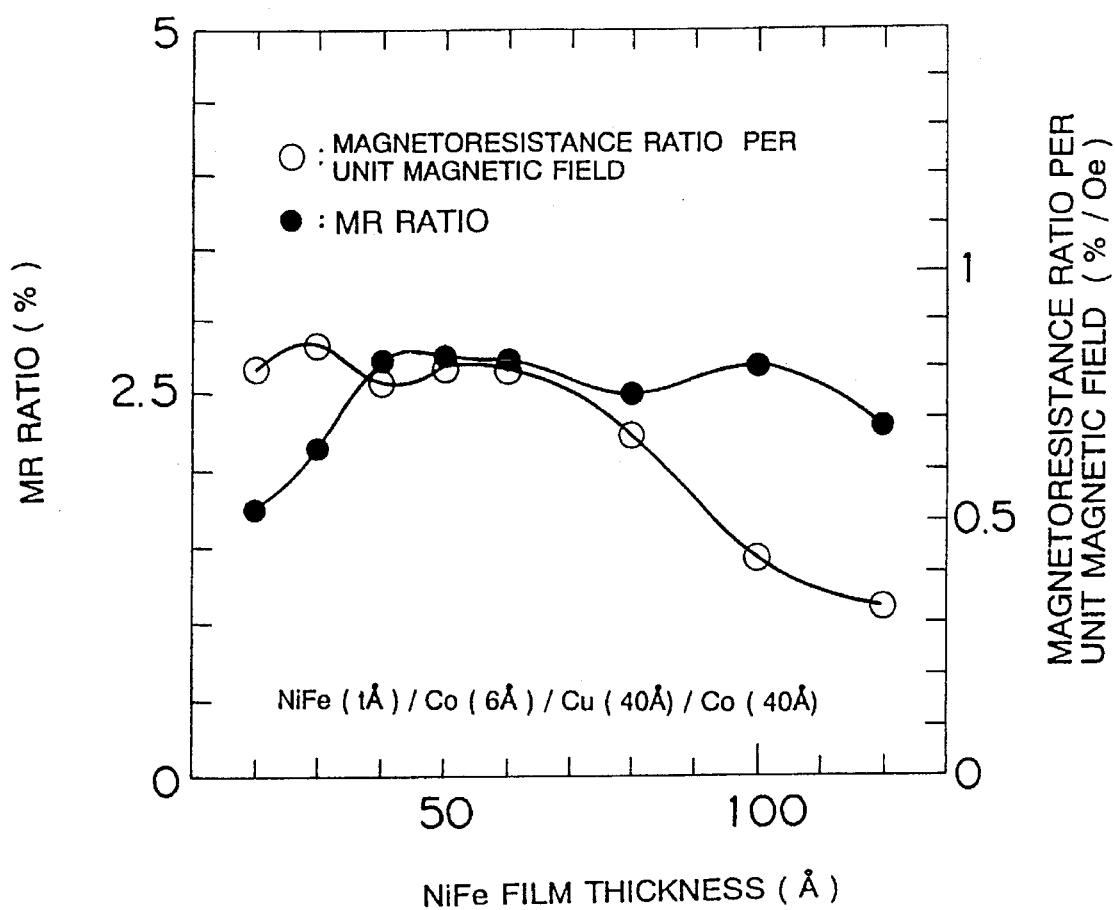
FIG. 50 illustrates relations between thicknesses of NiFe films, MR ratios and magnetoresistance ratios per unit magnetic field in Example 6.

FIG. 50 illustrates relations between the thicknesses of the NiFe films thus prepared, the MR ratios and the magnetoresistance ratios per unit magnetic field. As shown in FIG. 50, the MR ratios were reduced when the thicknesses of the NiFe films were not more than 30 Å. On the other hand, the magnetic field sensitivity levels were reduced when the thicknesses of the NiFe films exceeded 100 Å. Thus, it is understood that a preferable thickness of the NiFe film is about 40 to 80 Å.

As hereinabove described, a steep change of the MR ratio is recognized when the MR ratio is reduced ratio after peaking in the magnetoresistive film according to the present invention. Further, the hysteresis curve of the magnetoresistive film according to the present invention generally has a neck which is specific to a magnetization hysteresis curve and a steep magnetization transition portion following the neck. The steep change of the MR ratio follows such a neck of the hysteresis curve. The inventors suppose that such a steep change of the MR ratio is based on spin-flop transition of the first and second ferromagnetic layers exhibiting an antiferromagnetic magnetic coupling force. It is therefore clarified here that spin-flop transition described in the claims of the present application is a phenomenon which is specified by exhibition of the aforementioned change of the MR ratio and the aforementioned magnetization hysteresis curve.

Figure 51:
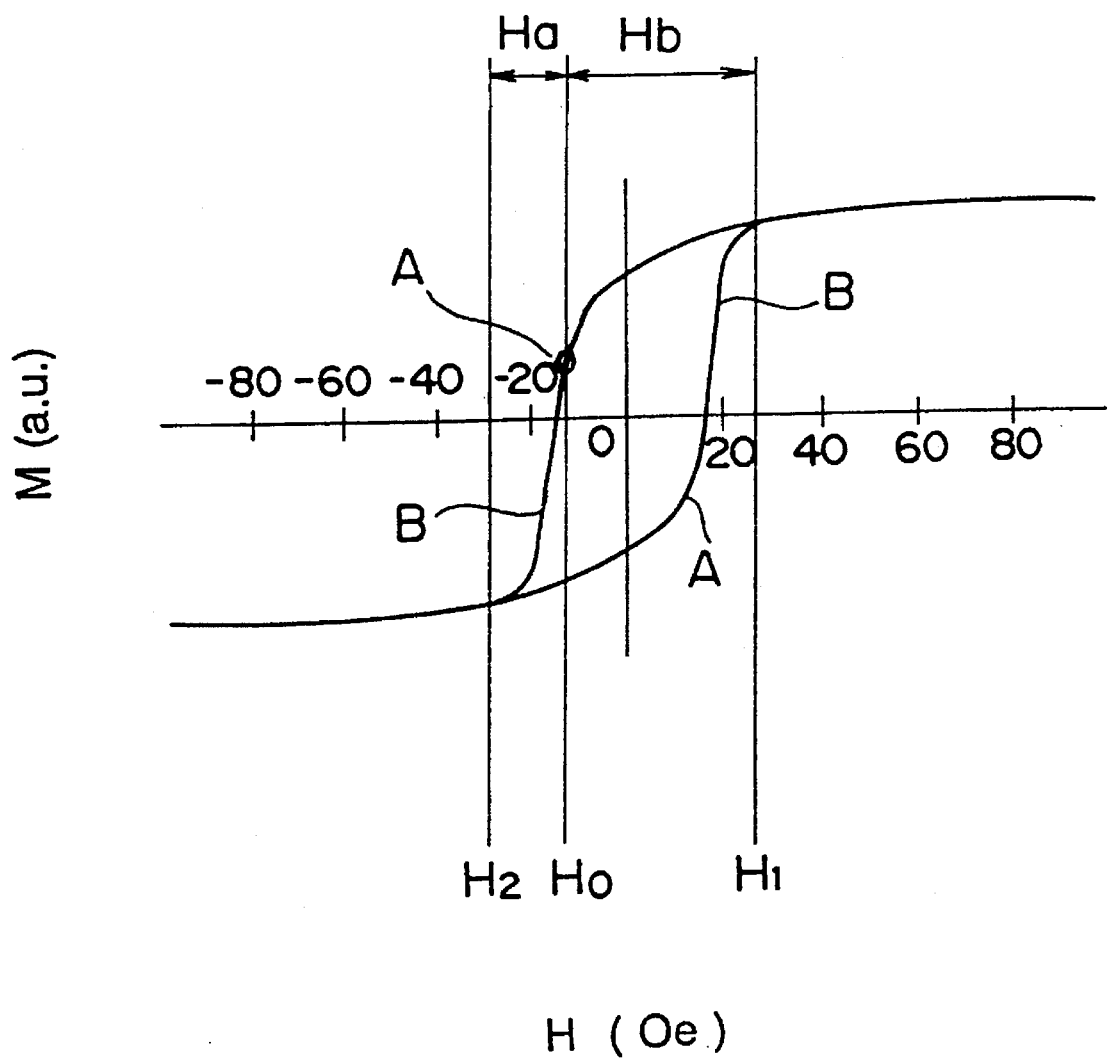
FIG. 51 illustrates the magnetization hysteresis curve of the sample 1-2 in Example 1, similarly to FIG. 3A.

With reference to FIG. 51, the first aspect of the present invention is now described. FIG. 51 illustrates the magnetization hysteresis curve of the sample 1-2 in the aforementioned Example 1, similarly to FIG. 3A. Referring to FIG. 51, symbol $H_0$ denotes a magnetic field at an intermediate inflection point among inflection points marked by "○", (note that the curve in FIG. 51 only has a single inflection point, which is thus considered as the "intermediate inflection point") symbol $H_1$ denotes a magnetic field of 95% of the first saturation magnetization, and symbol $H_2$ denotes a magnetic field of 95% of the second saturation magnetization after transition. Symbol Hb denotes a magnetic field change quantity of $H_1$ to $H_0$, and symbol Ha denotes that of $H_0$ to $H_2$. Therefore, the magnetic field change quantities Ha and Hb are expressed as follows:

$$Ha=|H_2-H_0|$$

$$Hb=|H_1-H_0|$$

From FIG. 51, $H_0$, $H_1$, $H_2$, Ha, Hb and Ha/Hb are at the following values:

$H_0=-15$ (Oe), $H_1=26$ (Oe), $H_2=-28$ (Oe)

Ha=13 (Oe)

Hb=41 (Oe)

Ha/Hb=0.32(≦1)

Thus, it is understood that the value of Ha/Hb is not more than 1.

Figure 52:
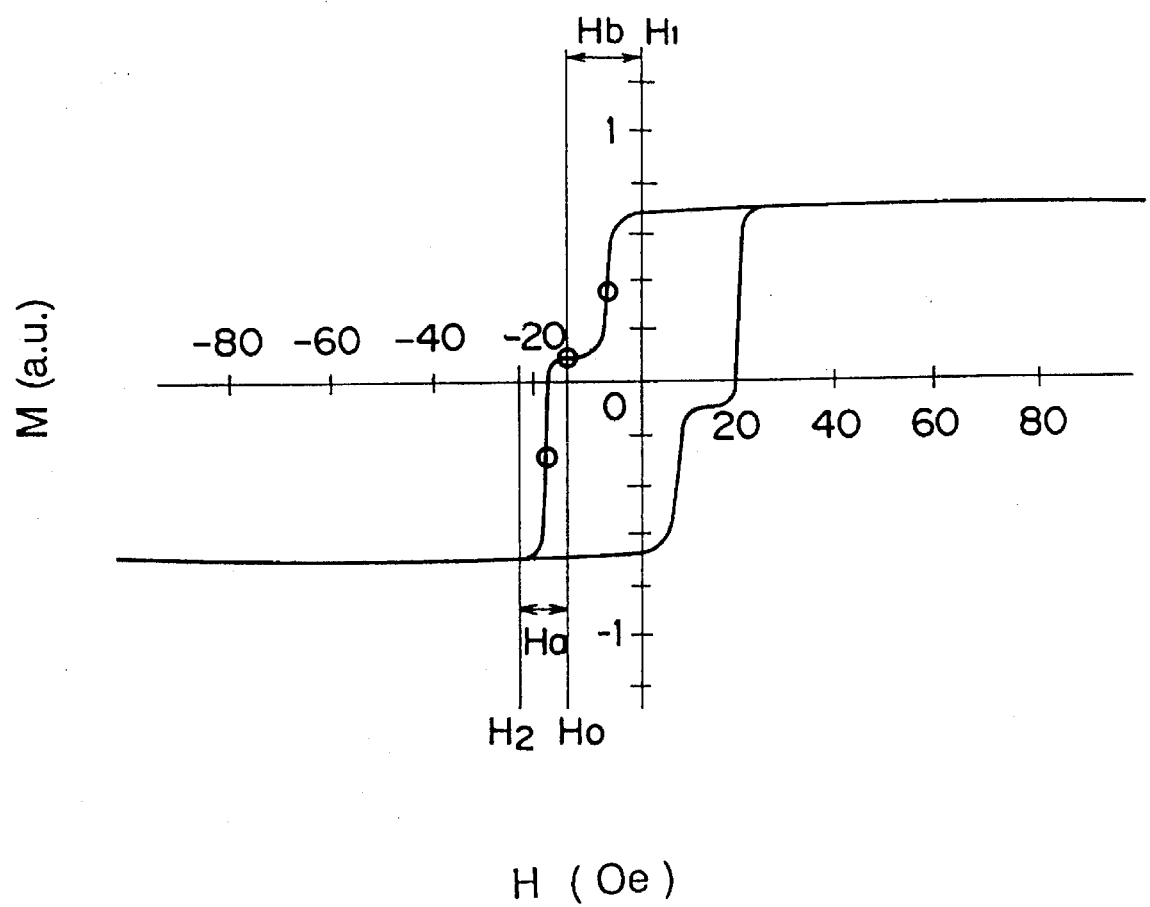
FIG. 52 illustrates the magnetization hysteresis curve of the sample 2-9 in Example 2, similarly to FIG. 28.

FIG. 52 illustrates the magnetization hysteresis curve of the sample 2-9 in Example 2, similarly to FIG. 28. FIG. 52 shows three inflection points marked by "○". It is understood from FIG. 52 that $H_0$, $H_1$, $H_2$, Ha, Hb and Ha/Hb are at the following values:

$H_0=-14$ (Oe), $H_1=0$ (Oe), $H_2=-24$ (Oe)

Ha=10 (Oe)

Hb=14 (Oe)

Ha/Hb=0.71 (≦1)

Thus, it is understood that the value of Ha/Hb is not more than 1 also in this Example.

As shown in FIGS. 51 and 52, each example has three inflection points in the process of magnetization transition.

Figure 53:
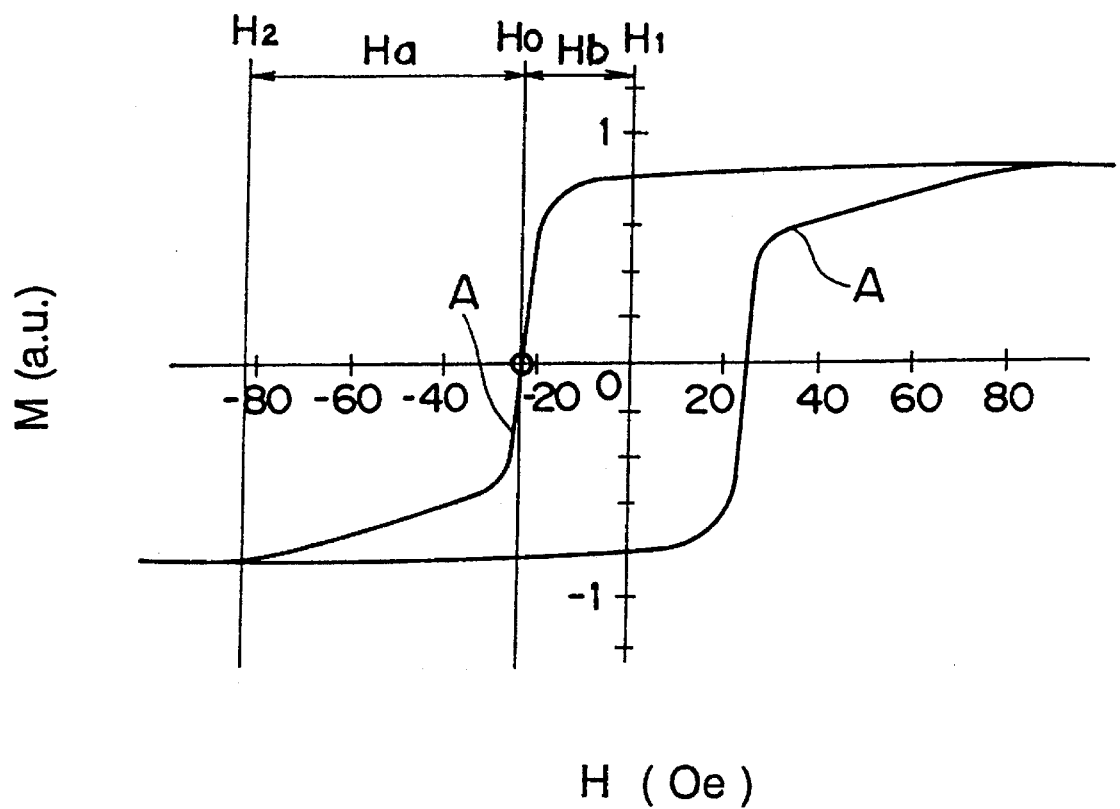
FIG. 53 illustrates the magnetization hysteresis curve of the sample 7-1 of comparative example, similarly to FIG. 35.

FIG. 53 illustrates the magnetization hysteresis curve of the sample 7-1 in the aforementioned comparative example, similarly to FIG. 35.

It is understood from FIG. 53 that $H_0$, $H_1$, $H_2$, Ha, Hb and Ha/Hb are at the following values:

$H_0=-23$ (Oe), $H_1=0$ (Oe), $H_2=-81$ (Oe)

Ha=58 (Oe)

Hb=23 (Oe)

Ha/Hb=2.5

Thus, it is understood that the value of Ha/Hb exceeds 1 in the comparative or conventional magnetoresistive film.

As shown in FIG. 53, the conventional film has only one inflection point in the process of magnetization transition.

In a similar manner to the above, values of Ha/Hb were calculated as to the samples 1-2 to 7-1 and Examples 4 and 5 respectively. Table 4 shows the results.

TABLE 4

| Sample No. | Ha/Hb |
|---|---|
| 1-2 | 0.45 |
| 1-4 | 0.95 |
| 1-5 | 0.32 |
| 1-6 | 0.80 |
| 1-9 | 0.31 |
| 2-2 | 0.42 |
| 2-3 | 0.44 |
| 2-4 | 0.35 |
| 2-5 | 0.36 |
| 2-6 | 0.38 |
| 2-7 | 0.80 |
| 2-8 | 0.35 |
| 2-9 | 0.62 |
| *7-1 | 2.5 |
| Example 4 | 0.77 |
| Example 5 | 0.68 |

*comparative sample

Comparative Sample

It is clearly understood from Table 4 that all of the Ha/Hb values of the inventive magnetoresistive films were not more than 1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetoresistive film comprising:

a first ferromagnetic layer arranged on a substrate and having a first coercive force;

a non-magnetic metal film arranged on said first ferromagnetic layer; and a second ferromagnetic layer arranged on said non-magnetic metal film and having a second coercive force that is different from said first coercive force;

wherein said first ferromagnetic layer and said second ferromagnetic layer are antiferromagnetically coupled with each other so that said magnetoresistive film has a magnetization hysteresis curve with at least one inflection point in a magnetization transition from a first saturation magnetization to a second saturation magnetization, wherein a total number of said at least one inflection point in said magnetization transition is an uneven number;

wherein Ha/Hb$\leq$0.95, where Ha=$|H_2-H_0|$ and Hb=$|H_1-H_0|$, with $H_0$ representing the magnetic field at an intermediate one of said at least one inflection point, $H_1$ representing the magnetic field corresponding to 95% of said first saturation magnetization, and $H_2$ representing the magnetic field corresponding to 95% of said second saturation magnetization; and wherein said magnetoresistive film has an MR ratio that depends on an applied magnetic field such that a curve representing said MR ratio relative to said applied magnetic field has a first portion that increases to a maximum value of said MR ratio and has a second portion that then decreases from said maximum value of said MR ratio as said applied magnetic field is varied monotonously, wherein a maximum slope of said second portion is steeper than a maximum slope of said first portion.

2. The magnetoresistive film in accordance with claim 1, wherein said non-magnetic metal film has a thickness of at least about 20 Å.

3. The magnetoresistive film in accordance with claim 1, wherein said first ferromagnetic layer has a face-centered cubic structure and is arranged directly on said substrate.

4. The magnetoresistive film in accordance with claim 1, wherein at least one of said first and second ferromagnetic layers comprises a nickel-iron alloy.

5. The magnetoresistive film in accordance with claim 1, wherein said non-magnetic metal film comprises copper, and said magnetoresistive film further comprises a cobalt layer arranged at at least one of a first location between said first ferromagnetic layer and said non-magnetic metal film and a second location between said second ferromagnetic layer and said non-magnetic metal film.

6. The magnetoresistive film in accordance with claim 1, comprising a plurality of sandwich structure films stacked on each other, wherein each said sandwich structure film comprises a respective unit of said first and second ferromagnetic layers with said non-magnetic metal film arranged therebetween.

7. The magnetoresistive film in accordance with claim 1, wherein said first ferromagnetic layer comprises a nickel-iron alloy film having a face-centered cubic structure and having a thickness of 40 to 100 Å.

8. The magnetoresistive film in accordance with claim 1, wherein said first ferromagnetic layer and said second ferromagnetic layer are coupled with each other in such a manner that said first and second ferromagnetic layers have respective first and second magnetization directions that are substantially perpendicular to each other.

9. The magnetoresistive film in accordance with claim 1, wherein said first and second ferromagnetic layers have respective magnetization directions that are changeable through a spin-flop transition responsive to a change of an external magnetic field applied to said magnetoresistive film.

10. The magnetoresistive film in accordance with claim 9, wherein at least one of said first ferromagnetic layer, said non-magnetic metal film, and said second ferromagnetic layer has a face-centered cubic crystal structure.

11. The magnetoresistive film in accordance with claim 1, wherein at least one of said first ferromagnetic layer and said second ferromagnetic layer respectively comprises a plurality of layers in a stacked structure.

12. The magnetoresistive film in accordance with claim 11, wherein said plurality of layers in said stacked structure comprises a Co layer and an NiFe layer.

13. The magnetoresistive film in accordance with claim 1, having exactly one said inflection point in said magnetization transition from said first saturation magnetization to said second saturation magnetization, wherein said intermediate inflection point is said exactly one inflection point.

14. The magnetoresistive film in accordance with claim 1, having at least three said inflection points in said magnetization transition from said first saturation magnetization to said second saturation magnetization, wherein said intermediate inflection point is a middle one of said inflection points.

15. The magnetoresistive film in accordance with claim 1, wherein said magnetoresistive film is composed of exactly one unit of said first ferromagnetic layer, said non-magnetic layer and said second ferromagnetic layer, arranged on said substrate, without any further ferromagnetic layer and without any further non-magnetic layer.

16. The magnetoresistive film in accordance with claim 1, wherein said film exhibits a magnetoresistance ratio of at least 1.9% and a magnetoresistance ratio per unit magnetic field of at least 0.63%/Oe.

17. The magnetoresistive film in accordance with claim 1, exhibiting a diffraction peak of a face-centered cubic structure in an X-ray diffraction pattern.

18. A magnetoresistive film comprising:
- a first ferromagnetic layer arranged on a substrate and having a first coercive force;
- a non-magnetic metal film arranged on said first ferromagnetic layer; and
- a second ferromagnetic layer arranged on said non-magnetic metal film and having a second coercive force that is different from said first coercive force;
- wherein said first ferromagnetic layer and said second ferromagnetic layer have respective magnetization directions that are changeable through a spin-flop transition responsive to a change of an external magnetic field applied to said magnetoresistive film.

19. The magnetoresistive film in accordance with claim 18, wherein said magnetoresistive film is composed of exactly one unit of said first ferromagnetic layer, said non-magnetic layer and said second ferromagnetic layer, arranged on said substrate, without any further ferromagnetic layer and without any further non-magnetic layer.

20. A magnetoresistive device comprising a magnetoresistive film, said magnetoresistive film comprising:
- a first ferromagnetic layer arranged on a substrate and having a first coercive force;
- a non-magnetic metal film arranged on said first ferromagnetic layer; and
- a second ferromagnetic layer arranged on said non-magnetic metal film and having a second coercive force that is different from said first coercive force;
- wherein said first ferromagnetic layer and said second ferromagnetic layer are antiferromagnetically coupled with each other so that said magnetoresistive film has a magnetization hysteresis curve with at least one inflection point in a magnetization transition from a first saturation magnetization to a second saturation magnetization, wherein a total number of said at least one inflection point in said magnetization transition is an uneven number;
- wherein $Ha/Hb \leq 0.95$, where $Ha=|H_2-H_0|$ and $Hb=|H_1-H_0|$, with $H_0$ representing the magnetic field at an intermediate one of said at least one inflection point, $H_1$ representing the magnetic field corresponding to 95% of said first saturation magnetization, and $H_2$ representing the magnetic field corresponding to 95% of said second saturation magnetization; and
- wherein said magnetoresistive film has an MR ratio that depends on an applied magnetic field such that a curve representing said MR ratio relative to said applied magnetic field has a first portion that increases to a maximum value of said MR ratio and has a second portion that then decreases from said maximum value of said MR ratio as said applied magnetic field is varied monotonously, wherein a maximum slope of said second portion is steeper than a maximum slope of said first portion.

* * * * *

UNITED STATES PATENT AND TRADEMARK OFFICE
CERTIFICATE OF CORRECTION

PATENT NO. : 5,620,784
DATED : Apr. 15, 1997
INVENTOR(S) : Tanuma et al.

It is certified that error appears in the above-identified patent and that said Letters Patent is hereby corrected as shown below:     On title page, In [56] References Cited, U.S. PATENT DOCUMENTS, replace
       "5,117,321  5/1992 Nakanishi et al." by
       --5,117,321  5/1982 Nakanishi et al.--;

In [56] References Cited, OTHER PUBLICATIONS, page 2,
       line 8, replace  "Hysteresis in Lithorgraphic Arrays"
               by --Hysteresis in Lithographic Arrays".

Col. 1, line 61, delete "by".
Col. 4, line 49, after "with" insert --a--.
Col. 5, line 26, replace "prensent" by --present--.
Col. 7, line 33, delete "to";
       line 55, delete "in";
       line 62, after "in" insert --a--.
Col. 8, line 51, replace "a" by --A--.
Col. 10, line 56, replace "in reduction." by --upon reduction thereof.--.
Col. 13, line 17, replace 'curve-has" by --curve has--.

Signed and Sealed this

Fifteenth Day of July, 1997

Attest:

BRUCE LEHMAN

Attesting Officer        Commissioner of Patents and Trademarks